United States Patent
Hayakawa et al.

(10) Patent No.: US 7,411,215 B2
(45) Date of Patent: *Aug. 12, 2008

(54) DISPLAY DEVICE AND METHOD OF FABRICATING THE SAME

(75) Inventors: Masahiko Hayakawa, Kanagawa (JP);
Satoshi Murakami, Tochigi (JP);
Shunpei Yamazaki, Tokyo (JP); Kengo Akimoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/412,234

(22) Filed: Apr. 14, 2003

(65) Prior Publication Data
US 2003/0193054 A1    Oct. 16, 2003

(30) Foreign Application Priority Data
Apr. 15, 2002   (JP) .............................. 2002-111745

(51) Int. Cl.
*H01L 31/036* (2006.01)

(52) U.S. Cl. .............................. 257/72; 257/59; 257/66; 257/67; 257/68; 257/69; 257/84; 257/89; 257/350; 257/E27.111; 257/E29.278

(58) Field of Classification Search .................. 257/72, 257/350, 59, 66–69, 84, 89, E27.111, E29.278
See application file for complete search history.

(56) References Cited

U.S. PATENT DOCUMENTS 5,313,076 A    5/1994   Yamazaki et al.
5,459,596 A * 10/1995   Ueda et al. ..................... 349/39
5,583,369 A    12/1996   Yamazaki et al.

(Continued)

FOREIGN PATENT DOCUMENTS

EP      1 122 773 A2    8/2001

(Continued)

OTHER PUBLICATIONS

U.S. Appl. No. 10/400,427, filed Mar. 28, 2003; Shunpei Yamazaki et al.; "Semiconductor Display Device".

(Continued)

*Primary Examiner*—Lynne A. Gurley
*Assistant Examiner*—Junghwa M Im
(74) *Attorney, Agent, or Firm*—Nixon Peabody LLP; Jeffrey L. Costellia

(57) ABSTRACT

To achieve promotion of stability of operational function of display device and enlargement of design margin in circuit design, in a display device including a pixel portion having a semiconductor element and a plurality of pixels provided with pixel electrodes connected to the semiconductor element on a substrate, the semiconductor element includes a photosensitive organic resin film as an interlayer insulating film, an inner wall face of a first opening portion provided at the photosensitive organic resin film is covered by a second insulating nitride film, a second opening portion provided at an inorganic insulating film is provided on an inner side of the first opening portion, the semiconductor and a wiring are connected through the first opening portion and the second opening portion and the pixel electrode is provided at a layer on a lower side of an activation layer.

28 Claims, 22 Drawing Sheets

U.S. PATENT DOCUMENTS

| | | | |
|---|---|---|---|
| 5,585,949 | A | 12/1996 | Yamazaki et al. |
| 5,696,386 | A | 12/1997 | Yamazaki |
| 5,706,064 | A | 1/1998 | Fukunaga et al. |
| 5,721,601 | A | 2/1998 | Yamaji et al. |
| 5,733,797 | A | 3/1998 | Yamaha |
| 5,781,254 | A | 7/1998 | Kim et al. |
| 5,818,550 | A | 10/1998 | Kadota et al. |
| 5,940,732 | A | 8/1999 | Zhang |
| 5,945,711 | A | 8/1999 | Takemura et al. |
| 5,946,561 | A | 8/1999 | Yamazaki et al. |
| 5,956,105 | A | 9/1999 | Yamazaki et al. |
| 5,982,460 | A | 11/1999 | Zhang et al. |
| 5,990,542 | A | 11/1999 | Yamazaki |
| 6,037,712 | A | 3/2000 | Codama et al. |
| 6,057,904 | A | 5/2000 | Kim et al. |
| 6,069,443 | A | 5/2000 | Jones et al. |
| 6,115,090 | A | 9/2000 | Yamazaki |
| 6,136,624 | A | 10/2000 | Kemmochi et al. |
| 6,150,692 | A | 11/2000 | Iwanaga et al. |
| 6,215,154 | B1 | 4/2001 | Ishida et al. |
| 6,236,106 | B1 | 5/2001 | Sato |
| 6,252,297 | B1 | 6/2001 | Kemmochi et al. |
| 6,271,066 | B1 | 8/2001 | Yamazaki et al. |
| 6,271,543 | B1 | 8/2001 | Ohtani et al. |
| 6,274,516 | B1 | 8/2001 | Kamei et al. |
| 6,274,887 | B1 | 8/2001 | Yamazaki et al. |
| 6,294,799 | B1 | 9/2001 | Yamazaki et al. |
| 6,306,559 | B1 | 10/2001 | Tanamura et al. |
| 6,306,694 | B1 | 10/2001 | Yamazaki et al. |
| 6,335,555 | B1 | 1/2002 | Takemura et al. |
| 6,346,718 | B1 | 2/2002 | Yamanaka et al. |
| 6,356,318 | B1 | 3/2002 | Kawahawa |
| 6,372,558 | B1 | 4/2002 | Yamanaka et al. |
| 6,429,053 | B1 | 8/2002 | Yamazaki et al. |
| 6,492,659 | B1 | 12/2002 | Yamazaki et al. |
| 6,514,855 | B1 | 2/2003 | Suzuki et al. |
| 6,515,300 | B2 | 2/2003 | Den Boer et al. |
| 6,538,301 | B1 | 3/2003 | Yamada et al. |
| 6,562,672 | B2 | 5/2003 | Yamazaki et al. |
| 6,593,990 | B1 | 7/2003 | Yamazaki |
| 6,599,818 | B2 | 7/2003 | Dairiki |
| 6,605,826 | B2 | 8/2003 | Yamazaki et al. |
| 6,608,353 | B2 | 8/2003 | Miyazaki et al. |
| 6,614,076 | B2 | 9/2003 | Kawasaki et al. |
| 6,617,611 | B2 | 9/2003 | Hasegawa et al. |
| 6,657,230 | B1 | 12/2003 | Murade |
| 6,664,145 | B2 | 12/2003 | Yamazaki et al. |
| 6,664,732 | B2 | 12/2003 | Yamazaki et al. |
| 6,689,492 | B1 | 2/2004 | Yamazaki et al. |
| 6,690,031 | B1 | 2/2004 | Ohtani et al. |
| 6,690,033 | B2 | 2/2004 | Yamazaki et al. |
| 6,739,931 | B2 | 5/2004 | Yamazaki et al. |
| 6,740,599 | B2 | 5/2004 | Yamazaki et al. |
| 6,768,259 | B2 | 7/2004 | Hirano |
| 6,774,578 | B2 | 8/2004 | Tanada |
| 6,777,710 | B1 | 8/2004 | Koyama |
| 6,778,232 | B2 | 8/2004 | Nakata et al. |
| 6,784,037 | B2 | 8/2004 | Yamazaki et al. |
| 6,784,949 | B1 | 8/2004 | Nagata et al. |
| 6,791,129 | B2 | 9/2004 | Inukai |
| 6,791,521 | B2 | 9/2004 | Isami et al. |
| 6,822,629 | B2 | 11/2004 | Yamazaki et al. |
| 6,828,950 | B2 | 12/2004 | Koyama |
| 6,905,903 | B2 | 6/2005 | Hasegawa et al. |
| 6,911,688 | B2 | 6/2005 | Yamazaki et al. |
| 6,936,846 | B2 | 8/2005 | Koyama et al. |
| 6,972,263 | B2 | 12/2005 | Yamazaki et al. |
| 6,977,394 | B2 | 12/2005 | Yamazaki et al. |
| 7,038,239 | B2 | 5/2006 | Murakami et al. |
| 7,141,821 | B1 | 11/2006 | Yamazaki et al. |
| 7,142,781 | B2 | 11/2006 | Koyama et al. |
| 7,148,510 | B2 | 12/2006 | Yamazaki et al. |
| 2001/0005606 | A1 | 6/2001 | Tanaka et al. |
| 2001/0009283 | A1 | 7/2001 | Arao et al. |
| 2001/0030322 | A1 | 10/2001 | Yamazaki et al. |
| 2001/0036462 | A1 | 11/2001 | Fong et al. |
| 2001/0051416 | A1 | 12/2001 | Shunpei et al. |
| 2001/0053559 | A1 | 12/2001 | Nagao et al. |
| 2001/0055841 | A1 | 12/2001 | Yamazaki et al. |
| 2002/0036462 | A1 | 3/2002 | Hirano |
| 2002/0145116 | A1 | 10/2002 | Choo et al. |
| 2002/0155706 | A1 | 10/2002 | Mitsuki et al. |
| 2003/0057419 | A1 | 3/2003 | Murakami et al. |
| 2003/0090447 | A1 | 5/2003 | Kimura |
| 2003/0129790 | A1 | 7/2003 | Yamazaki et al. |
| 2003/0189207 | A1 | 10/2003 | Murakami et al. |
| 2003/0189210 | A1 | 10/2003 | Yamazaki et al. |
| 2003/0193054 | A1 | 10/2003 | Hayakawa et al. |
| 2003/0197178 | A1 | 10/2003 | Yamazaki et al. |
| 2003/0206332 | A1 | 11/2003 | Yamazaki et al. |
| 2003/0210358 | A1 | 11/2003 | Zhang et al. |
| 2003/0230764 | A1 | 12/2003 | Yamazaki et al. |
| 2004/0072380 | A1 | 4/2004 | Yamazaki et al. |
| 2004/0075094 | A1 | 4/2004 | Yamazaki et al. |
| 2004/0080263 | A1 | 4/2004 | Yamazaki et al. |
| 2004/0135181 | A1 | 7/2004 | Yamazaki et al. |
| 2005/0205868 | A1 | 9/2005 | Yamazaki et al. |
| 2005/0233507 | A1 | 10/2005 | Yamzaki et al. |
| 2005/0287722 | A1 | 12/2005 | Zhang |
| 2006/0060861 | A1 | 3/2006 | Yamazaki et al. |
| 2007/0001236 | A1 | 1/2007 | Yamazaki et al. |

FOREIGN PATENT DOCUMENTS

| | | |
|---|---|---|
| EP | 1 128 430 A2 | 8/2001 |
| EP | 1 128 439 A2 | 8/2001 |
| EP | 1 148 553 A2 | 10/2001 |
| EP | 1 566 837 A2 | 8/2005 |
| JP | 01-156725 | 6/1989 |
| JP | 02-039541 | 2/1990 |
| JP | 02-234134 | 9/1990 |
| JP | 07-273191 | 10/1995 |
| JP | 08-152651 | 6/1996 |
| JP | 08-181214 | 7/1996 |
| JP | 08-203876 | 8/1996 |
| JP | 10-39334 | 2/1998 |
| JP | 10-048668 | 2/1998 |
| JP | 10-056182 | 2/1998 |
| JP | 10-068972 | 3/1998 |
| JP | 10-307305 | 11/1998 |
| JP | 11-183929 | 7/1999 |
| JP | 11-345981 | 12/1999 |
| JP | 2001-189462 | 7/2001 |
| JP | 2001-223267 | 8/2001 |
| JP | 2001-313397 | 11/2001 |
| JP | 2001-318622 | 11/2001 |
| JP | 2001-318628 | 11/2001 |
| JP | 2001-356711 | 12/2001 |
| JP | 2002-006777 | 1/2002 |
| JP | 2003-017273 | 1/2003 |

OTHER PUBLICATIONS

U.S. Appl. No. 10/412,687, filed Apr. 14, 2003; Shunpei Yamazaki et al.; "Semiconductor Display Device and Manufacturing Method Thereof".

U.S. Appl. No. 10/407,184, filed Apr. 17, 2003; Satoshi Murakami et al.; "Semiconductor Element and Display Device Using the Same".

U.S. Appl. No. 10/419,764, filed Apr. 22, 2003; Shunpei Yamazaki et al.; "Semiconductor Device and Display Element Using Semiconductor Device".

* cited by examiner

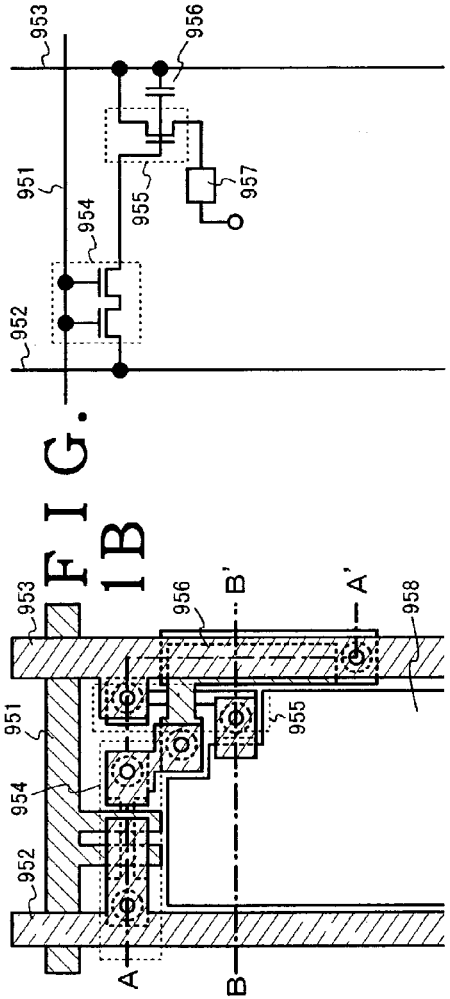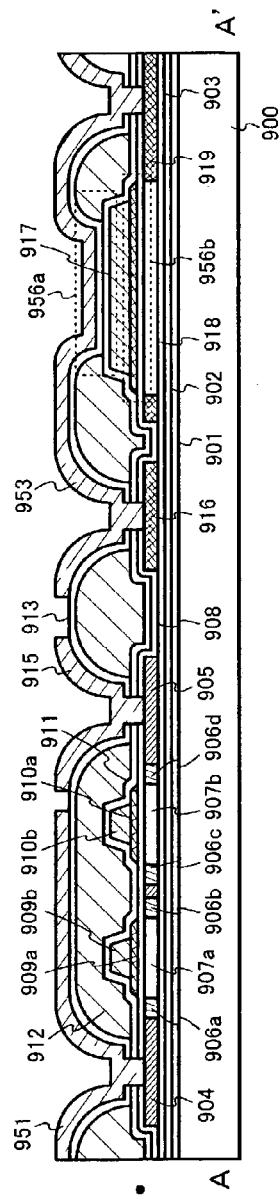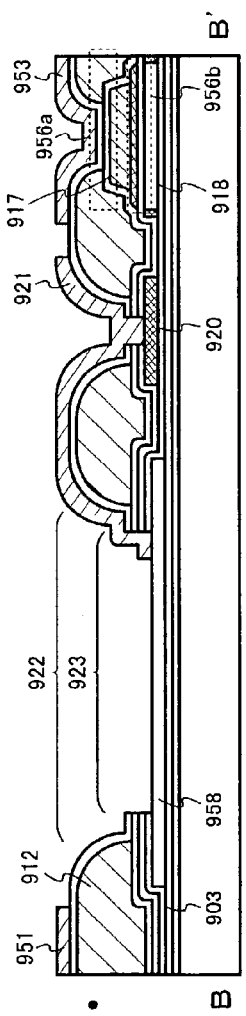

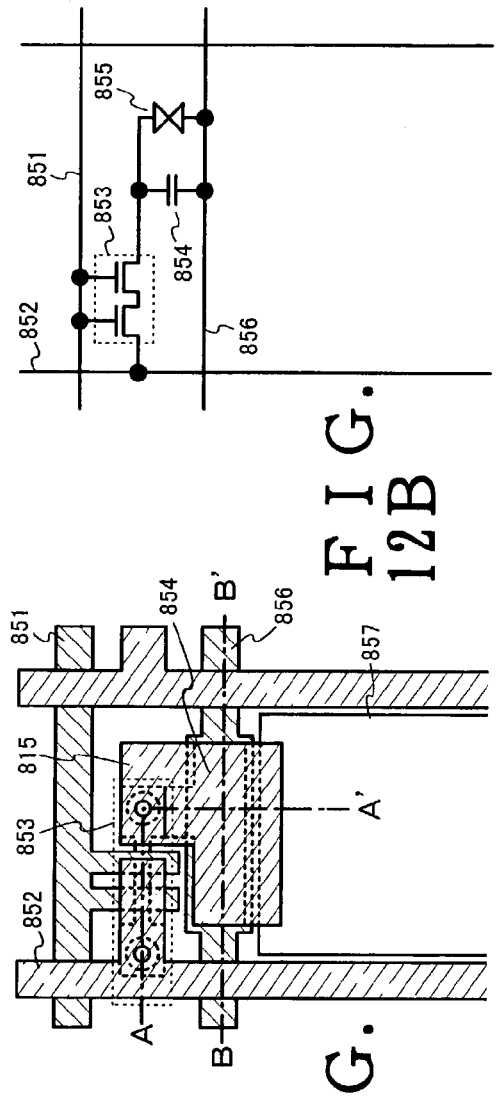

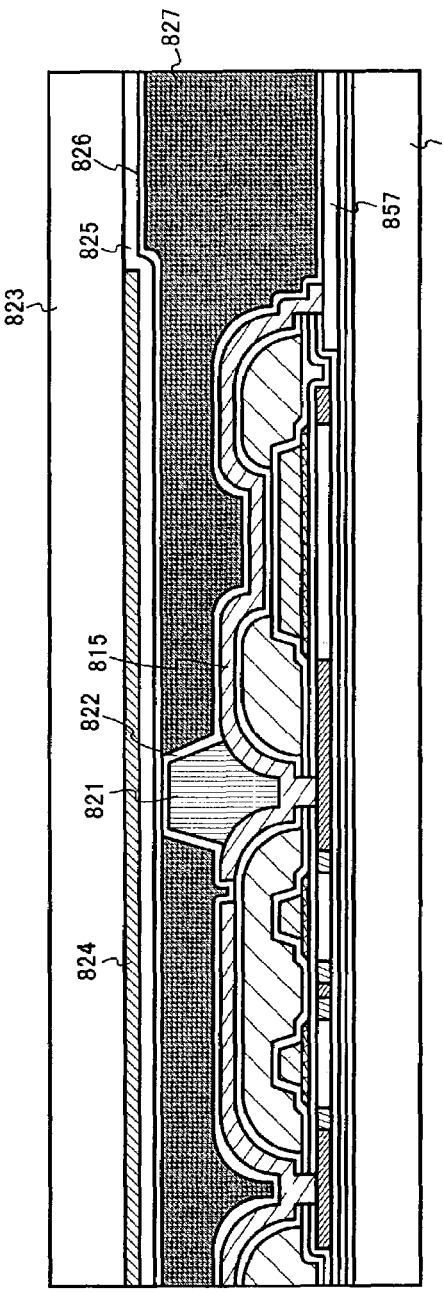
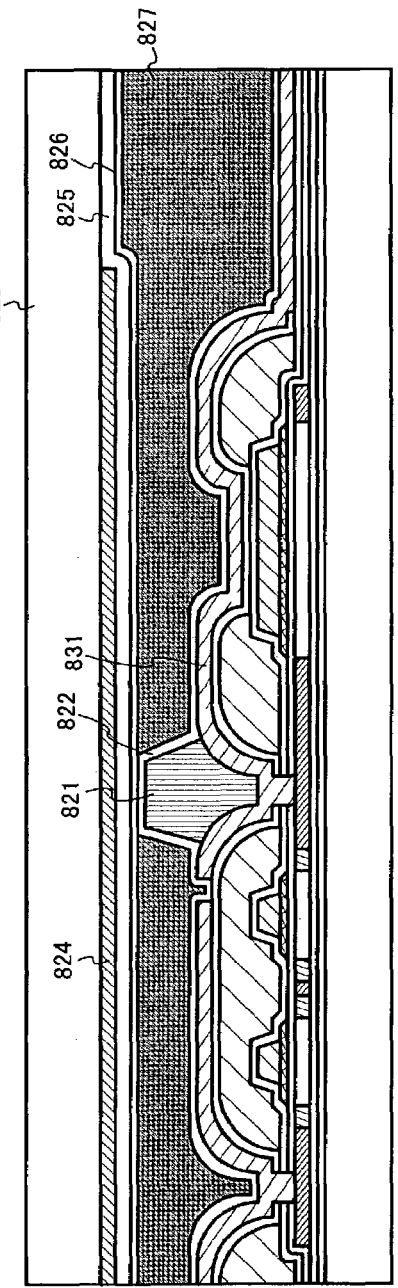
FIG. 13A
FIG. 13B

Characteristics of MOS-CV
( Si\SiO₂\RF-SP SiN\Li-dip\Al )

Characteristics of MOS-CV
(Si wafer\CVD SiN(100nm)\Al-Li)

FIG. 18A
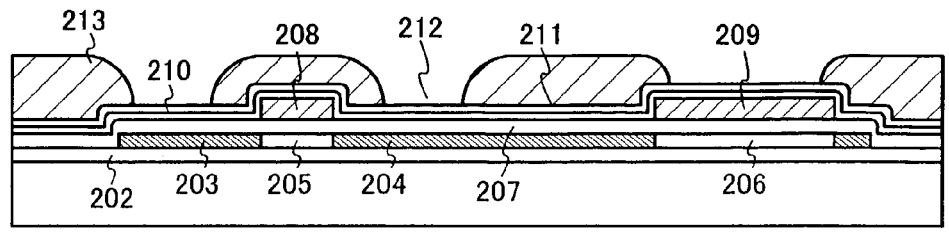
FIG. 18B
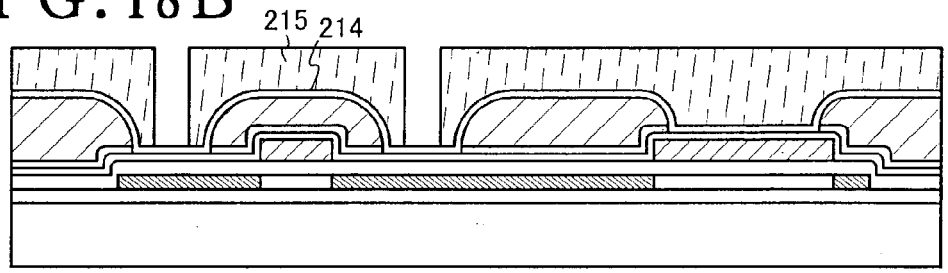
FIG. 18C
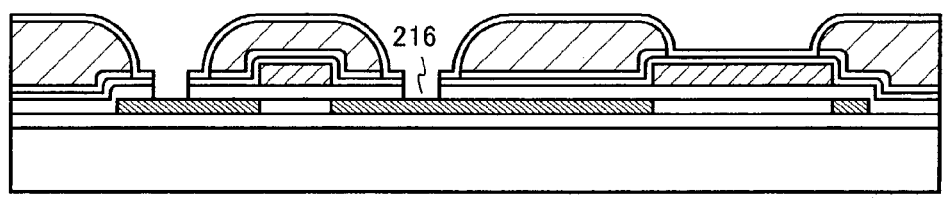
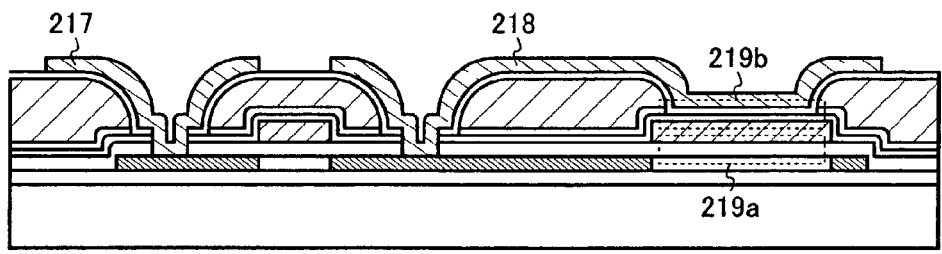
FIG. 18D

DISPLAY DEVICE AND METHOD OF FABRICATING THE SAME

BACKGROUND OF THE INVENTION

1. Field of the Invention

The present invention relates to a semiconductor element (typically, a transistor) and a manufacturing method thereof, and more specifically belongs to a technique of a display device using a thin film transistor as a device. That is, the present invention belongs to a technique concerning a display device represented by a liquid crystal display device, an electroluminescence display device, or the like, a technique concerning a sensor represented by a CMOS sensor or the like, and other techniques concerning various semiconductor devices in which a semiconductor integrated circuit is mounted.

2. Description of the Related Art

In recent years, the development for a liquid crystal display device and an electroluminescence display device in which thin film transistors (TFTs) are integrated on a glass substrate has been progressed. These display devices each are one of semiconductor devices characterized in that thin film transistors are formed on a glass substrate using a thin film formation technique and a liquid crystal element or an electroluminescence (hereinafter referred to as just an EL) element is formed on various circuits composed of the thin film transistors, so that a function as a display device is provided.

The circuits composed of the thin film transistors cause unevenness to some extent. Thus, when a liquid crystal element or an EL element is formed on the circuits, a leveling processing using an organic resin film or the like is generally conducted. Each pixel which is provided in a display portion of a display device has a pixel electrode therein. The pixel electrode is connected with the thin film transistor through a contact hole provided in the above-mentioned organic resin film for leveling.

However, the following facts are found by the studies of the present applicant. That is, when a resin film is used as an interlayer insulating film and a contact hole is formed using a dry etching technique, threshold voltages (Vth) of the completed thin film transistors are greatly varied. For example, data shown in FIGS. 4A and 4E are results examined with respect to a variation in threshold voltages of thin film transistors formed on an SOI substrate. In the drawings, a black circular mark indicates the case where a laminate structure of a silicon nitride film (SiN) and an acrylic film is used for the interlayer insulating film. In addition, an outline triangular mark in the drawings indicates the case where a laminate structure of a silicon nitride oxide film (SiNO) and a silicon oxynitride film (SiON) is used for the interlayer insulating film. In any case, the dry etching technique is used for the formation of the contact hole. Note that "SiNO" and "SiON" are separately used according to the meaning in which the former contains the amount of nitrogen larger than oxygen and the latter contains the amount of oxygen larger than nitrogen.

The datas shown in FIG. 6A and FIG. 6B are graphs obtained by evaluating a variations in threshold voltages using statistical processing. The ordinate indicates a channel length (carrier moving length) and the abscissa indicates a Vth variation. In recent years, "quartile deviation" has been known as statistical processing. The quartile deviation is a difference between a value of 25% and a value of 75% in a normal probability graph and has been noted as statistical processing which is not influenced by an abnormal value. The present applicant defines, based on the quartile deviation (which is also called 25 percentile deviation), a difference between a value of 0.16% and a value of 84% as. 16 percentile deviation, and plots its value as "a Vth variation" in the abscissa. Note that the 16 percentile deviation corresponds to $\pm 6$ in a normal probability distribution. Thus, values, which are assumed as $\pm 3 6$ by respectively multiplying by factors, are used for data plotting. When an acrylic film is used as an interlayer insulating film, as seen from the data, a variation in an n-channel TFT is about 4 times and a variation in a p-channel TFT is about 2 times those of the case not using the acrylic film. Thus, it is apparent that a variation is large in the case where the acrylic film is used. The present applicant estimates that a charge is captured in the acrylic film by plasma damage in dry etching, thereby providing a cause of varying a threshold voltage.

SUMMARY OF THE INVENTION

The invention has been carried out in view of the above-described problem and it is a first problem thereof to provide a technology of fabricating a thin film transistor without dispersing threshold voltage thereof in fabricating a display device in which an organic resin film is used as an interlayer insulating film to thereby achieve to promote stability of operational function of the display device and enlarge design margin in circuit design. Further, it is a second problem thereof to provide a fabricating process preferable in reducing the number of steps of the technology to thereby achieve to reduce fabricating cost of a display device, particularly, a light emitting device.

The invention is characterized in resolving the first problem by the following means. That is, the invention is characterized in using a photosensitive organic resin film (preferably, photosensitive acrylic film, particularly, positive type photosensitive acrylic film) as an organic resin film, forming a first opening at the photosensitive organic resin film, thereafter forming an insulating nitride film covering the first opening, forming again a second opening at the insulating nitride film by using a photoresist and electrically connecting an upper electrode and a lower electrode present to interpose the organic resin film.

Means for resolving the first problem (hereinafter, referred to as first aspect of the invention) will be explained in reference to FIGS. 3A and 3B. In FIG. 3A, notation 101 designates a substrate, notation 102 designates a base film, notation 103 designates a source region, notation 104 designates a drain region, notation 105 designates a channel forming region and these are constituted by using semiconductor films provided above the film 102. Further, notation 106 designates a gate insulating film, notation 107 designates a gate electrode and notation 108 designates a first passivation film. Heretofore, a structure of a publicly-known thin film transistor is shown and with regard to materials of respective portions, all of publicly-known materials can be used.

Next, a first characteristic of a thin film transistor according to the first aspect of the invention resides in that a photosensitive type organic resin film, particularly, a positive type photosensitive acrylic film is used above the first passivation film 108 which is an inorganic insulating film as an interlayer insulating film 109. A film thickness of the photosensitive organic resin film 109 may be selected in a range of 1 through 4 μm (preferably, 1.5 through 3 μm). Further, a second characteristic thereof resides in that a first opening portion (designated by diameter φ1) 110 is provided at the photosensitive organic resin film 109 and a second passivation film 111 which is an inorganic insulating film is provided to cover an upper face of the photosensitive organic resin film 109 and an inner wall face of the first opening portion 110. Further, a third characteristic thereof reside in that the second passivation film 111 includes a second opening portion (designated by diameter φ2) 112 at a bottom face of the first opening portion 110 and opening portions are formed also at the first passivation film 108 and the gate insulating film 106 with a diameter the same as that of the second opening portion 112. That is, the characteristic resides in that the second opening portion provided at a laminated layer body including the gate insulating film 106, the first passivation film 108 and the second passivation film 111 is provided on an inner side of the first opening portion 110. Further, a source electrode 113 is connected to the source region 103 via the first opening portion 110 and the second opening portion 112 and a drain electrode 114 is similarly connected to the drain region 104.

Further, as the first passivation film 108 and the second passivation film 111, the silicon nitride film, a silicon nitrooxide film, a silicon oxynitride film, an aluminum nitride film, an aluminum nitrooxide film or an aluminum oxynitride film can be used. Further, a laminated layer film including these films at at least a portion thereof may be constituted. Further, the diameter φ1 may be 2 through 10 μm (preferably, 3 through 5 μm) and the diameter φ2 may be 1 through 5 μm (preferably, 2 through 3 μm). However, the diameters need not to restrict to the numeral value ranges since the design rule of the diameters of the opening portions are changed also by accuracy of photolithography steps. That is, at any rate, a relationship of φ1>φ2 may be satisfied.

Here, FIG. 3B shows a view enlarging a portion of a region 115 surrounded by dotted lines. FIG. 3B shows portions of the first opening portion 110 and the second opening portion 112. The first opening portion 110 is formed with a gradual curved face at an inner wall face thereof and is provided with a radius of curvature which is continuously changed. For example, when attention is paid to radii of curvature R1, R2 and R3 successively, a relationship of the respective radii of curvature becomes R1<R2<R3 and numerical values thereof fall in a range of 3 through 30 μm (representatively, 10 through 15 μm). Further, at a bottom face of the first opening portion 110, an angle made by the photosensitive organic resin film 109 and the first passivation film 108 (contact angle θ) falls in a range of 30°<θ<65° (representatively, 40°<θ<50°).

In this case, in FIG. 3B, a portion designated by notation 116 constitutes a state in which the first passivation film 108 and the second passivation film 110 are brought into close contact with each other to seal the photosensitive organic resin film 109. In this case, a length of the close contact region, that is, a region of bringing the first passivation film 108 and the second passivation film 111 into contact with each other may be 0.3 through 3 μm (preferably, 1 through 2 μm), specifically, a radius of the first opening portion 110 may be larger than a radius of the second opening portion 112 by 0.3 through 3 μm.

The photosensitive organic resin film (here, positive type photosensitive acrylic film) used in the first aspect of the invention may generate a gas component in forming and after forming a thin film transistor and therefore, it is very important in the significance of preventing a deterioration in a liquid crystal element or an EL element formed above the thin film transistor to seal the photosensitive organic resin film by inorganic insulating films having excellent close contact performance (particularly, silicon nitride film or a silicon nitrooxide film having high barrier performance is preferable).

Further, it seems that when the contact angle (θ) shown in FIG. 3B is reduced, an inclination of an inner wall face of the first opening portion 110 becomes gradual and therefore, in FIG. 3A, a distance between an upper end portion (corner) of the gate electrode 107 and the inner wall face of the first opening portion 110 is shortened, however, three layers of insulating films of the first passivation film 108, the photosensitive organic resin film 109 and the second passivation film 111 are actually present between the gate electrode 107 and the wiring 113 and therefore, a problem of shortcircuit or the like cannot be posed.

Next, a method of fabricating the thin film transistor having the structure shown in FIGS. 3A and 3B will be explained in reference to FIGS. 4A, 4B, 4C, 4D and 4E. First, FIG. 4A will be explained. The base film 102 is formed above the substrate 101 and a semiconductor film etched in an island-like shape is formed thereabove. Further, the gate insulating film 106 is formed and the gate electrode 107 is formed thereabove and the source region 103 and the drain region 104 are formed self-adjustingly by using the gate electrode 107 as a mask. At this occasion, the channel forming region 105 is partitioned simultaneously. When the source region 103 and the drain region 104 are formed, the source region 103 and the drain region 104 are activated by a heating treatment, the first passivation film 108 is formed and thereafter, a hydrogenating treatment is carried out by a heating treatment. The fabricating method heretofore may be carried out by using a public-known technology and as materials constituting the thin film transistor, all of publicly-known materials can be used. Next, as the interlayer insulating film 109, a photosensitive organic resin film, in this case, a positive type photosensitive acrylic film is formed.

Next, FIG. 4B will be explained. When the photosensitive organic resin film 109 is formed, an exposing treatment by a photolithography step is carried out and the photosensitive organic resin film 109 is etched to thereby form the first opening portion 110. The step is a technology enabled by the photosensitive organic resin film, further, the etching per se is wet etching by a developing solution and therefore, an effect that the above-described problem of plasma damage is not posed is achieved. After etching by the developing solution, a decoloring treatment of the photosensitive organic resin film 109 is carried out. The decoloring treatment may be carried out by irradiating light stronger than light used in exposing to a total of a pattern. Further, the decoloring treatment needs to carry out immediately after exposing, that is, before a curing treatment. Because after curing, bridging of the photosensitive organic resin film 109 is finished and therefore, decoloring by irradiating light cannot be carried out.

Further, a sectional shape of the first opening portion 110 becomes as shown by FIG. 3B and includes a very gradual inner wall face. Therefore, coverage of an electrode to be formed later becomes extremely excellent. Further, in the curing step after etching, in order to prevent adsorption or absorption of moisture or oxygen into the resin, it is preferable to heat in an inactive atmosphere (nitrogen atmosphere, rare gas atmosphere or hydrogen atmosphere). At this occasion, by constituting the inactive atmosphere completely from elevating temperature to lowering temperature, an amount of adsorbing (or absorbing) moisture and oxygen is preferably retrained to be equal to or smaller than 10 ppm (preferably, equal to or smaller than 1 ppm).

Next, FIG. 4C will be explained. When the first opening portion 110 is formed, the second passivation film 111 is formed to cover an upper face of the photosensitive organic resin film 109 and an inner wall face of the first opening portion 110. A material of the second passivation film 111 may be the same as that of the first passivation film 108. In forming the second passivation film 111, a sputtering method by high frequency discharge is preferably used. As conditions therefor, a silicon target may be used and nitrogen gas may be used as sputtering gas. Although the pressure may pertinently be set, the pressure may be set to 0.5 through 1.0 Pa, discharge power may be set to 2.5 through 3.5 KW and film forming temperature may fall in a range from room temperature (25° C.) to 250° C. Further, when the second passivation film 111 is formed, a photoresist 201 is formed. The photoresist 201 is a mask for forming the second opening portion 112 to the second passivation film 111.

Next, FIG. 4D will be explained. When the photoresist 201 is formed, the second passivation film 111, the first passivation film 108 and the gate insulating film 106 are successively etched by carrying out an etching treatment to thereby form the second opening portion 112. At this occasion, although the etching treatment may be a dry etching treatment or a wet etching treatment, in order to improve the shape of the second opening portion 112, the dry etching treatment is preferable. According to the invention, even when the dry etching treatment is carried out here, the photosensitive organic resin film 109 is not directly exposed to plasma. One of the characteristics of the first aspect of the invention may reside in that while protecting the inner wall face of the opening portion provided at the photosensitive organic resin film by an insulating nitride film of a silicon nitride film or the like, the opening portion having a smaller diameter is provided at the bottom face of the opening portion in this way.

Further, in forming the second opening portion 112 by the dry etching treatment, the gate insulating film 106 and the first passivation film 108 are etched and productivity of the etching can be promoted by a combination of inorganic insulating films. That is, when a silicon nitride film is used as the first passivation film 108 and a silicon oxynitride film is used as the gate insulating film 106, in etching the first passivation film 108, the gate insulating film 106 can be made to function as an etching stopper and in etching the gate insulating film 106, the source region (silicon film) 103 can be made to function as an etching stopper.

For example, consider a case in which a silicon oxynitride film is used for the gate insulating film 106 and a silicon nitride film is used for the first passivation film 108. Although the silicon nitride film functioning as the first passivation film 108 can be etched by using carbon tetrafluoride ($CF_4$) gas, helium (He) gas and oxygen ($O_2$) gas, these gases also etch the silicon film. However, the silicon oxynitride film functioning as the gate insulating film 106 of the matrix is operated as the etching stopper and therefore, the silicon film functioning as the source region 103 is not eliminated. Further, the gate insulating film (here, silicon oxynitride film) 106 can be etched by using hydrocarbon trifluoride ($CHF_3$) gas, further, the silicon film is hardly etched thereby and therefore, the source region 103 can be made to function as the etching stopper.

Next, FIG. 4E will be explained. When the second opening portion 112 is formed, a metal film is formed thereabove and patterned by etching to thereby form the source electrode 113 and the drain electrode 114. In order to form the electrodes, a titanium film, a titanium nitride film, a tungsten film (including alloy thereof), an aluminum film (including alloy thereof) or a laminated layer film of these may be used.

The thin film transistor having the structure explained in reference to FIGS. 3A and 3B can be provided by carrying out the operation as described above. The thin film transistor provided in this way includes the photosensitive organic resin film and the photosensitive organic resin film functions also as a flattening film. Further, the photosensitive organic resin film is sealed by the insulating nitride film (representatively, silicon nitride film or silicon nitrooxide film) and therefore, a problem by degassing is not posed.

An explanation will be given here of reason that the positive type photosensitive acrylic film is particularly preferable as the photosensitive organic resin film 109.

First, a photograph shown in FIG. 5A is a sectional SEM (scanning electrode microscope) photograph of a state in which a nonphotosensitive acrylic film (film thickness: about 1.3 μm) is subjected to a dry etching treatment to pattern and FIG. 5B is a schematic diagram thereof. When a nonphotosensitive acrylic film is subjected to a dry etching treatment as in a related art, a curved face is hardly formed at an upper portion of a pattern to constitute an upper end portion which is not substantially provided with a radius of curvature (R). Further, although at a lower portion of the pattern, a taper angle (contact angle) is about 63° and a curved face is not observed also at the lower end portion.

Next, a photograph shown in FIG. 7A is a sectional SEM photograph of a state in which a positive type photosensitive acrylic film (film thickness: about 2.0 μm) is subjected to exposing and developing treatments to pattern and FIG. 7B is a schematic diagram thereof. A sectional shape of the positive type photosensitive acrylic film is provided with a very gradual curved face after an etching treatment by a developing solution and a radius of curvature (R) is continuously changed. Further, also a contact angle is provided with a small value of about 32 through 33°. That is, the shape is the shape shown by FIG. 3B as it is and can be said to be very useful shape in fabricating a thin film transistor and a display device of the invention. Naturally, the value of the contact angle is changed by an etching condition or a film thickness, however, $30° < \theta < 65°$ may be satisfied as mentioned above.

Next, a photograph shown in FIG. 8A is a sectional SEM photograph of a state in which a negative type photosensitive acrylic film (film thickness: about 1.4 μm) is subjected to exposing and developing treatments to pattern and FIG. 8B is a schematic diagram thereof. A sectional shape of the negative type photosensitive acrylic film is formed with a gradual curved face in an S-like shape after an etching treatment by a developing solution and is curved by a certain radius of curvature (R) at an upper end portion of the pattern. Further, the contact angle is provided with a value of about 47°. In this case, a length of a portion of tail (skirt) designated by notation W of FIG. 8B poses a problem. Particularly, at a contact hole (opening portion) which needs fine machining, when the tail portion is prolonged, there is a concern of bringing about a situation in which an electrode or a wiring at a lower layer is not exposed at inside of the contact hole and there is a concern of disconnection by contact failure. However, when the length (W) of the tail portion is equal to or smaller than 1 μm (preferably, length less than a radius of the contact hole), such a possibility of disconnection is reduced.

Next, a photograph shown in FIG. 9A is a sectional SEM photograph of a state in which a positive type photosensitive polyimide film (film thickness: about 1.5 μm) is subjected to exposing and developing treatments and FIG. 9B is a schematic diagram thereof. Although a sectional shape of the positive type photosensitive polyimide film is provided with more or less of a tail portion (designated by a length W) and a curved upper end portion after an etching treatment by a developing solution, a radius of curvature (R) thereof is small.

When the above-described sectional shapes are observed, the following analysis can be carried out. When a metal film for constituting an electrode or a wiring is formed after forming a contact hole (opening portion), a sputtering method, a vapor deposition method or a CVD method is used. When molecules of a material for constituting a thin film are adhered to a face to be formed, the molecules are moved on a surface while seeking for a stable site and it is known that the molecules are liable to gather to a portion of a shape having an acute angle as in an upper end portion of a contact hole (shape for constituting a projected portion). The tendency is remarkable particularly in a vapor deposition method. Therefore, when the sectional shape of the opening portion is the shape as shown by FIG. 5A, the molecules of the material are concentrated on an edge of the opening portion and therefore, the film thick thickness is increased locally only at the portion to form a projected portion in an eaves-like shape. The projected portion causes a failure of disconnection (bench cut) or the like and therefore, is not preferably. Therefore, the non-photosensitive acrylic film shown in FIG. 5A and the positive type photosensitive polyimide film shown in FIG. 9A can be said to be disadvantageous materials in view of the coverage.

Further, with regard to the shape formed with the tail portion at the lower end portion of the contact hole as in FIG. 8A and FIG. 9A, the tail portion covers a bottom face of the contact hole depending on cases, there is a concern of bringing about contact failure and therefore, the materials can be said to be disadvantageous materials in view of contact performance. Naturally, when a length of the tail portion is equal to or smaller than 1 μm (preferably, length less than the radius of the contact hole), no problem is posed.

From the above-described point, in embodying the invention, the positive type photosensitive acrylic film constituting the shape shown in FIG. 7A can be said to be most preferable. That is, when the positive type photosensitive acrylic film is used, the very gradual curved face is provided at the upper end portion of the contact hole and therefore, no problem is posed in the coverage, further, at the lower end portion of the contact hole, the bottom face of the contact hole is firmly partitioned by the contact angle satisfying 30°<θ<65° without forming the tail portion and therefore, the problem of contact failure is not also posed. From the above-described reason, in embodying the invention, the applicant considers that the positive type photosensitive acrylic film is the most preferable material as an interlayer insulating film comprising an organic resin.

As described above, in fabricating the thin film transistor using the organic resin film as the interlayer insulating film, the photosensitive organic resin film is used as the interlayer insulating film, further, by constituting the contact structure as shown by FIG. 3B, the thin film transistor can be fabricated without dispersing threshold voltage and promotion of stability of operational function of not only the thin film transistor but also the display device using the thin film transistor and enlargement of design margin in circuit design can be achieved.

Further, an explanation will be given in reference to FIGS. 1A, 1B, 1C and 1D. FIGS. 1A, 1B, 1C and 1D show a light emitting device (specifically, EL display device) fabricated by a fabricating process preferable in embodying the first aspect of the invention.

In FIGS. 1A, 1B, 1C and 1D, FIG. 1A is a top view of a pixel of a light emitting device (however, up to forming a pixel electrode), FIG. 1B is a circuit diagram thereof and FIGS. 1C and 1D are sectional views respectively taken along a line A-A' and a line B-B' of FIG. 1A.

As shown by FIGS. 1A and 1B, a display portion of the light emitting device is provided with a plurality of pixels surrounded by a gate wiring 951, a data wiring 952 and a power source wiring (wiring supplying constant voltage or constant current) 953 in matrix arrangement and each of the pixels is provided with TFT functioning as a switching element (hereinafter, referred to as switching TFT) 954, TFT functioning as means for supplying current or voltage for making an EL element emit light (hereinafter, referred to as driving TFT) 955, a capacitor portion 956 and an EL element 957. The EL element 957 can be formed by providing an EL layer on an upper side of a pixel electrode 958, although not illustrated here.

Further, although in the embodiment, as the switching TFT 954, an n-channel type TFT of a multigate structure is used and as the driving TFT 955, a p-channel type TFT is used, the pixel constitution of the light emitting device needs not to limit thereto but can be embodied for all of publicly-known constitutions.

The sectional view of FIG. 1C shows the n-channel type TFT 954 and the capacitor portion 956. Notation 900 designates a substrate and a glass substrate, a ceramic substrate, a quartz substrate, a silicon substrate or a plastic substrate (including plastic film) can be used therefor. Further, notation 901 designates a silicon nitrooxide film as a first base film and notation 902 designates a silicon oxynitride film as a second base film. Naturally, the films need not to limit to these materials. Further, the first base film 901 and the second base film 902 may be formed at layers on a lower side of an activation layer provided to a thin film transistor and therefore, need not to be provided at layers on a lower side of the pixel electrode. The first base film or the second base film may be formed at a layer on an upper side of the pixel electrode and an upper side of a pixel portion may be opened by including the base film.

The pixel electrode 958 formed by patterning a conductive oxide film is previously formed above the second base film 902. The point is the most important characteristic. By previously providing the pixel electrode 958 before forming a thin film transistor (that is, provided at a layer on a lower side of the activation layer), there is not posed a problem of damage inflicted on the thin film transistor in polishing to flatten the pixel electrode which becomes problematic when the pixel electrode is provided at a layer on an upper side of the thin film transistor as in an ordinary case and therefore, promotion of stability of operational function of the thin film transistor can be achieved. Further, since only the base film 1 and the base film 2 are present at layers on a lower side of the pixel electrode, the polishing can be carried out in a flatter state. Further, although as the pixel electrode 958, a conductive oxide film (representatively, ITO film) transparent with respect to visible light is used, the pixel electrode 958 does not need to limit thereto but may use other conductive oxide film. Further, the characteristic resides in that a silicon oxynitride film 903 is provided above the pixel electrode 958 as a third base film and it is preferable to use an insulating film having a material the same as that of the gate insulating film to be formed later or having a high selection ratio with the activation layer. In such a significance, a silicon oxide film may be used in place of the third base film 903.

As described above, the base film is constituted by a laminated layer body of the first base film 901, the second base film 902 and the third base film 903 and the pixel electrode 958 is provided in a state of being covered by the base film constituting the laminated layer body (embedded state).

Further, the activation layer of the n-channel type TFT 954 is provided above the silicon oxide film 903, the activation layer includes a source region 904, a drain region 905, LDD regions 906a through 906d and channel forming regions 907a and 907b, and the two channel forming regions and the four LDD regions are provided between the source region 904 and the drain region 905. At this occasion, although the semiconductor film constituting the activation layer can be formed by a publicly-known technology, it is preferable to form the semiconductor film in a temperature range which does not effect adverse influence on the conductive oxide film previously formed. Representatively, it is preferable to use a low temperature process of a laser crystallizing technology or a crystallizing technology using nickel.

Further, the activation layer of the n-channel type TFT 954 is covered by a gate insulating film 908, and gate electrodes 909a and 909b and gate electrodes 910a and 910b are provided thereabove. Although according to the second aspect of the invention, a silicon oxynitride film is used for the gate insulating film 908, when an insulating nitride film, mentioned above, of an aluminum nitride film having a high specific inductive capacity is used, the insulating nitride film is effective in increasing an integration degree since an occupied area of the element can be reduced.

Further, as the gate electrodes 909a and 910a, tantalum nitride films are used and as the gate electrodes 909b and 910b, tungsten films are used. The metal films are provided with high selection ratios with each other and therefore, by selecting etching conditions, a structure as shown by FIG. 1B can be constituted. With regard to the etching condition, JP-A-2001-313397 by the applicant may be referred to.

Further, as a first passivation film 911 covering the gate electrodes, a silicon nitride film or a silicon nitrooxide film is provided and a photosensitive organic resin film 912 (a positive type photosensitive acrylic film is used according to the second aspect of the invention) is provided thereabove. Further, the photosensitive organic resin film 911 is provided with a second passivation film 913 to cover a first opening portion (refer to FIG. 1C) and a second opening portion (refer to FIG. 1C) is provided at a bottom face of the first opening portion. According to the second aspect of the invention, as the second passivation film 913, a silicon nitride film or a silicon nitrooxide film is used. Naturally, other insulating nitride film of an aluminum nitride film or an aluminum nitrooxide film can also be used.

Further, the data wiring 952 is connected to the source region 904 via the first opening portion and a connecting wiring 915 is connected to the drain region 905 via the second opening portion. The connecting wiring 915 is a wiring connected to the gate of the driving TFT 954. As the data wiring 952 and the connecting wiring 915, a structure of interposing a wiring whose major component is a metal having low resistance of aluminum or copper by other metal films or a film of an alloy of these metals may be used.

Further, notation 916 designates a source region of the driving TFT 955 connected with the power source wiring 953. A contact portion related to the connection is formed with the first opening portion and the second opening portion by embodying the first aspect of the invention. Further, the power source wiring 953 is opposed to a gate wiring 917 of the driving TFT 955 via the first passivation film 911 and the second passivation film 913 and forms a storage capacitor 956a. Further, the gate wiring 917 is opposed to a semiconductor film 918 via the gate insulating film 908 and forms a storage capacitor 956b. Since the power source wiring 953 is connected to a semiconductor film 919, the semiconductor film 918 functions as an electrode by being supplied with electric charge therefrom. The capacitor portion 956 is constructed by a constitution of connecting the storage capacitors 956a and 956b in parallel and therefore, large capacitance is provided by a very small area. Particularly, a silicon nitride film having a high specific inductive capacity as a dielectric body is used for the storage capacitor 956a and therefore, large capacitance can be ensured. Further, a dielectric body of the storage capacitor 956a is constituted by a laminated layer structure of the first passivation film 911 and the second passivation film 913 and therefore, a probability of producing pin holes is extremely low and a highly reliable capacitor can be formed.

When the first aspect of the invention is embodied, in comparison with a related art, since the second opening portion is formed, the number of masks used in photolithography steps is increased, however, by conversely utilizing the increase in the number of masks, as shown by the embodiment, the storage capacity can newly be formed. The point is also one of significant characteristics of the first aspect of the invention. The characteristic compensates for a disadvantage of the increase in the masks, as a result, contributes significantly to development of industry. For example, in order to achieve display of highly fine image, it is necessary to increase a numerical aperture by reducing an occupied area of a storage capacitor relative to an area of each pixel in a display portion and for such purpose, an increase in the storage capacitor is extremely useful.

Further, in FIG. 1D, notation 920 designates a drain region of the driving TFT 955 which is connected to a drain wiring 921. Further, the drain region 921 is connected to the pixel electrode 958 via a first opening portion 922 and a second opening portion 923 provided above the pixel electrode 958. At this occasion, when the second opening portion 923 is formed, the second opening portion 923 is formed by etching the second passivation film 913, the first passivation film 911 and the gate insulating film 908 and successively etching also the silicon oxide film 903. That is, during a time period of etching the silicon oxide film 903, it is necessary to prevent semiconductor films of the source region 904, the drain region 905 and the drain region 920 from being etched. For that purpose, as described above, the silicon oxynitride film 903 having a material the same as that of the gate insulating film 908 is selected.

FIGS. 2A and 2B show an example of actually forming an EL element in the light emitting device having the above-described pixel constitution. Further, portions of FIGS. 2A and 2B the same as those of FIGS. 1A, 1B, 1C and 1D are designated by numerals the same as those of FIGS. 1A, 1B, 1C and 1D. FIG. 2A is a view in correspondence with a section shown by FIG. 1D, showing a state of forming an EL element 957 above the pixel electrode 958. Further, when a structure of FIG. 2A is constituted, the pixel electrode 958 corresponds to an anode of the EL element 957. Further, in the specification, the EL element refers to an element provided with an EL layer between a cathode and an anode for emitting light by applying voltage or injecting current to the EL layer.

The thin film transistor formed at an end portion of the pixel electrode 958 and above the substrate is covered by a photosensitive organic resin film 961. It has a useful significance to protect the end portion of the pixel electrode 958 by the insulating film (first photosensitive organic resin film 912) since when the EL layer is provided at the end portion of the pixel electrode 958, shortcircuit between the anode and the cathode by bench cut poses a problem or there is a concern of deteriorating the EL layer by concentrating an electric field. Further, the photosensitive organic resin film 961 is provided in a lattice shape to fringe the respective pixels or provided in a stripe shape by a unit of row or a unit of column. The light emitting device having the structure of the invention is previously formed with the pixel electrode 958 and therefore, provided with a function of protecting the end portion of the pixel electrode.

Further, according to the light emitting device having the structure shown in FIGS. 2A and 2B, as the photosensitive organic resin film (second photosensitive organic resin film) 961, a material the same as that of the photosensitive organic resin film (first photosensitive organic resin film) 912 used as the interlayer insulating film (positive type photosensitive acrylic film according to the second aspect of the invention) is used and therefore, a production facility can be minimized. Further, although not illustrated, a negative type photosensitive acrylic film constituting a sectional shape in an S-like shape shown in FIGS. 8A and 8B may be used. Naturally, in this case, it is preferable to set radii of curvature at an upper end portion and a lower end portion of an opening portion to 3 through 30 μm (representatively, 10 through 15 μm). Further, in that case, when the length of the tail portion designated by notation W is not made as short as possible, the numerical aperture is reduced, which is not preferable. Further, a publicly-known resist material (high molecular material including chromofore) can be used.

Further, a surface of the photosensitive organic resin film 961 is covered by an insulating nitride film as a third passivation film 962 to thereby enable to restrain degassing from the photosensitive organic resin film 961. Further, the third passivation film 962 is etched to provide an opening portion above the pixel electrode 958 and an EL layer 963 and the pixel electrode 958 are brought into contact with each other at the opening portion. Although the EL layer 963 is generally constituted by laminating thin films of a luminescent layer, a charge injecting layer and a charge transporting layer, all of structures and materials confirming luminescence can be used. For example, SAlq (triphenylsilanol structure substitutes for one of three ligands of $Alq_3$) constituting an organic material including silicon as an electron transporting layer or a hole blocking layer can also be used.

Naturally, it is not necessary to constitute the EL layer 963 only by organic thin films but may be constituted by a structure of laminating an organic thin film and an inorganic thin film, or a polymeric thin film or a low molecular thin film. Further, although a method of forming the film differs by using the high molecular thin film or using the low molecular thin film, the film may be formed by a publicly-known method.

Further, a cathode 964 is provided above the EL layer 963 and an insulating nitride film as a fourth passivation film 965 is finally provided further thereabove. Although the cathode 964 may use a metal thin film including an element belonging to group I or group II of the periodic table, a metal film of aluminum added with 0.2 through 1.5 wt % (preferably, 0.5 through 1.0 wt %) of lithium is preferable in view of charge injecting performance and the like. Further, although there is a concern that the lithium is harmful for operation of TFT by being diffused, according to the embodiment, since the EL layer 963 is completely protected by the first passivation film 911, the second passivation film 913 and the third passivation film 962 and therefore, it is not necessary to be mindful of diffusion of lithium.

Here, FIGS. 17A and 17B show data indicating an effect of a silicon nitride film formed by a sputtering method by high frequency discharge of blocking against lithium. FIG. 17A shows a C-V characteristic of an MOS structure constituting a dielectric body by a silicon nitride film formed by a sputtering method by high frequency discharge (designated as RF-SP SiN). Further, notation "Li-dip" signifies that a solution including lithium is subjected to spin coating above the silicon nitride film and signifies that the film is intentionally contaminated by lithium for the sake of test. The silicon nitride film formed by the sputtering method by high frequency discharge is formed by using a circular Si target having a radius of 12 inch under conditions of a gas flow rate ratio of $N_2$:Ar=20:20 (sccm), film forming gas pressure of 0.8 Pa, film forming power of 3 kW in high frequency power and substrate temperature of 200° C. FIG. 20 and Table 1 show a result of measuring a composition of the silicon nitride film formed by the sputtering method by high frequency discharge by SIMS.

TABLE 1

|  | H | C | O | Ar |
|---|---|---|---|---|
| Concentration (atoms/cm³) | $5 \times 10^{20}$ | $4 \times 10^{19}$ | $2 \times 10^{21}$ | $3 \times 10^{20}$ |

Further, FIG. 17B shows a C-V characteristic of an MOS structure constituting a dielectric body by a silicon nitride film formed by a plasma CVD method for comparison (designated as CVD SiN). The silicon nitride film formed by the plasma CVD method is formed under conditions of gas flow rates of $SiH_4$:$NH_3$:$N_2$:$H_2$=30:240:300:60 (sccm), pressure of 159 Pa, frequency of 13.56 MHz, power of 0.35 W/cm² and substrate temperature of 325° C. Further, data of FIG. 17B uses a film of an alloy of aluminum added with lithium as a metal electrode. These films (silicon nitride film formed by sputtering method by high frequency discharge, silicon nitride film formed by plasma CVD method) are subjected to normal BT test (specifically, a heating treatment is carried out for 1 hour at ±150° C. in addition to application of voltage of 1.7 MV), as a result, as shown by FIG. 17A, in comparison with the fact that a change is hardly observed in the C-V characteristic in the silicon nitride film formed by the sputtering method by high frequency discharge, a significant change is observed in the C-V characteristic in the silicon nitride film formed by the plasma CVD method and contamination by lithium is confirmed. The data indicates that the silicon nitride film formed by the sputtering method by high frequency discharge is provided with a very effective blocking effect against diffusion of lithium.

Further, a heat radiating effect can be expected by using the insulating nitride film as the second passivation film 913 or the third passivation film 962. For example, when the heat conductivity of a silicon oxide film is set to 1, very high heat conductivities are provided for a silicon nitride film of about 5 and an aluminum nitride film of about 35 through 130 and therefore, when the EL element is heated, the heat is radiated effectively and a deterioration of the EL layer 963 by self heat generation can be restrained.

Further, the third passivation film 962 and the fourth passivation film 965 can use a material the same as that of the insulating nitride film used in the first passivation film 911 or the second passivation film 913.

In the case of the structure shown in FIG. 2A, there is constituted a lower emitting type in which light emitted from the EL element is emitted from a side of the substrate 901 by transmitting through the pixel electrode 958. In the case of the lower emitting type, since the invention is provided with the structure in which the pixel electrode is provided at the layer on the lower side of the activation layer of the thin film transistor and therefore, in comparison with a case in which the pixel electrode is provided at a layer on an upper side of the thin film transistor as in an ordinary case, the number of layers through which light emitted from the EL layer transmits is small (light transmits only pixel electrode, base film 1, base film 2 and glass substrate) and therefore, the structure is advantageous in view of transmittance of light.

Next, FIG. 2B shows an example of a metal film 971 having reflecting performance in place of the pixel electrode 958 and as the metal film 971 having the reflecting performance, a metal film having a high work function of platinum (Pt) or gold (Au) for functioning as an anode is used. Further, since the metals are expensive, there may be constituted a pixel electrode which is laminated above a pertinent conductive film of an aluminum film, a tungsten film or a silicon film at least the topmost surface of which is exposed with platinum or gold. Particularly, when a silicon film is used, the silicon film can be formed simultaneously with the activation layer of the thin film transistor, which is preferable. Notation 972 designates an EL layer and all of structures and materials confirming luminescence can be used therefor similar to the case of FIG. 2A. Further, notation 973 designates a metal film having a thin film thickness (preferably, 10 through 50 nm) and a metal film including an element belonging to group I or group II of the periodic table is used for functioning as a cathode. Further, a conductive oxide film (representatively, ITO film) 974 is provided to laminate the metal film 973 and a fourth passivation film 975 is provided thereabove.

In the case of the structure shown in FIG. 2B, light emitted from the EL element is reflected by the pixel electrode 971 and emitted from the substrate by transmitting through the metal film 973 and the conductive oxide film 974.

Although FIG. 2A shows the case in which light emitted from the EL element is emitted from the substrate 901 by transmitting through the pixel electrode 958 (lower emitting type) and FIG. 2B shows the case in which light emitted from the EL element is reflected by the pixel electrode 971 and emitted by transmitting through the metal film 973 and the conductive oxide film 974 (upper emitting type), a structure in which light emitted from the EL element is emitted from both of an upper side and a lower side. In this case, a conductive oxide film having light transmitting performance (representatively, ITO film) may substitute for the metal film 971 having the reflecting performance of FIG. 2B to form a pixel electrode. FIG. 19 shows an example of a specific structure. In FIG. 19, notation 981 designates a pixel electrode formed by a conductive oxide film of ITO film or the like, notation 982 designates an EL layer, and notation 983 designates a metal film having a thin film thickness (preferably, 10 through 50 nm). As the metal film 983, a metal film including an element belonging to group I or group II of the periodic table is used for functioning as a cathode. Further, a conductive oxide film (representatively, ITO film) 984 is provided to laminate the metal film 983 and a fourth passivation film 985 is provided thereabove.

Further, means for resolving the second problem (hereinafter, referred to as second aspect of the invention) will be explained as follows in reference to FIGS. 21A and 21B. The second aspect of the invention is a light emitting device (specifically, EL display device) fabricated by the fabricating process preferable in embodying the first aspect of the invention and is an aspect of the invention characterized in that the fabricating process is reduced by reducing the number of laminated layers as a whole and fabricating cost is reduced as a result.

According to the structure shown by FIGS. 2A and 2B, since the pixel electrode is previously provided before forming the thin film transistor and therefore, it is not necessarily needed to provide a flattening film which is necessary when the pixel electrode is provided at a layer on an upper side of the thin film transistor (in FIGS. 2A and 2B, photosensitive organic resin film 961) as in an ordinary case. FIGS. 21A and 21B show a structure when the photosensitive organic resin film 961 is not provided. FIG. 21A shows a case in which the photosensitive organic resin film 961 of FIG. 2A is not provided and FIG. 21A shows a case in which the photosensitive organic resin film 961 of FIG. 2B is not provided. In FIG. 21A, notation 991 designates an insulating nitride film which is a third passivation film, notation 992 designates a cathode, notation 993 designates an insulating nitride film which is a fourth passivation film. FIG. 21A differs from FIG. 2A only in that the photosensitive organic resin film is not provided. In FIG. 21B, notation 994 designates an insulating nitride film which is a third passivation film, notation 995 designates a metal film having a thin film thickness (preferably, 10 through 50 nm), notation 996 designates a conductive oxide film (representatively, ITO film), and notation 997 designates an insulating nitride film which is a fourth passivation film. FIG. 21B differs from FIG. 2B only in that the photosensitive organic resin film is not provided. When the photosensitive organic resin film 961 is not provided as in the above-described cases, the number of masks can be reduced by one sheet (mask for forming the photosensitive organic resin film 961). An advantage of capable of reducing the number of steps is achieved and the second problem of the invention can be resolved. Naturally, the above-described effect in the structure shown in FIGS. 2A and 2B, that is, the effect by which there is not posed the problem of damage inflicted on the thin film transistor when the pixel electrode is polished to flatten and the effect by which the polishing can be carried out in the flatter state are also achieved.

BRIEF DESCRIPTION OF THE DRAWINGS

FIGS. 1A, 1B, 1C and 1D are views showing a pixel constitution of a light emitting device;

FIGS. 12A, 12B, 12C and 12D are diagrams showing a pixel constitution of a liquid crystal display device;

FIGS. 13A and 13B are views showing a sectional structure of a liquid crystal display device;

FIGS. 18A, 18B, 18C and 18D are views showing steps of fabricating a thin film transistor and a storage capacitor;

DETAILED DESCRIPTION OF PREFERRED EMBODIMENTS

Embodiment 1

Figure 3A:
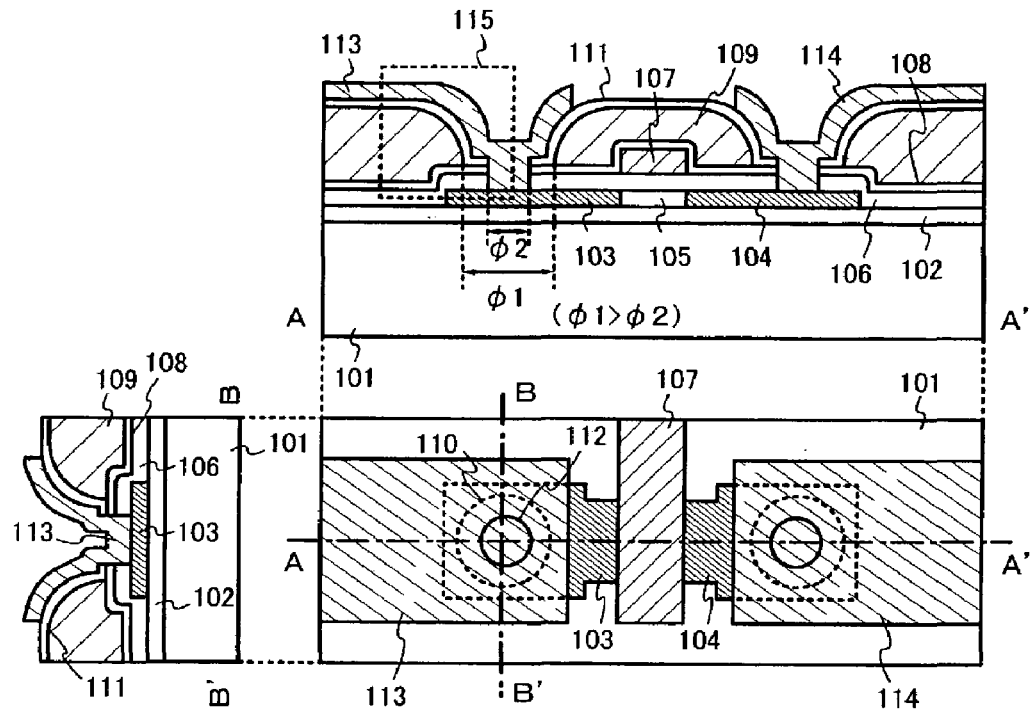
FIGS. 3A and 3B are views showing a structure of a thin film transistor.
Figure 3B:
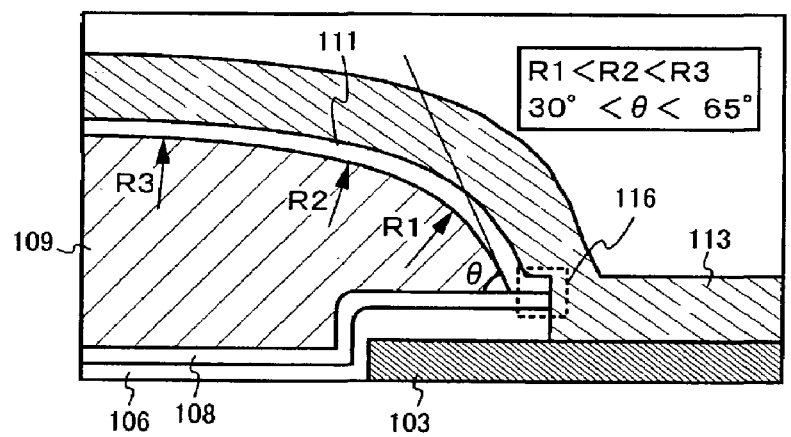
Figure 4A:
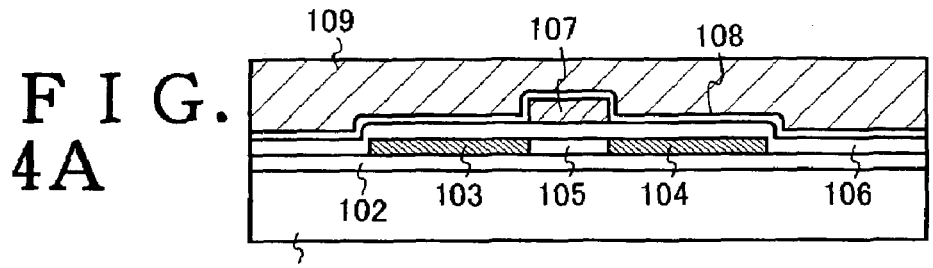
FIGS. 4A, 4B, 4C, 4D and 4E are views showing steps of fabricating the thin film transistor.
Figure 4B:
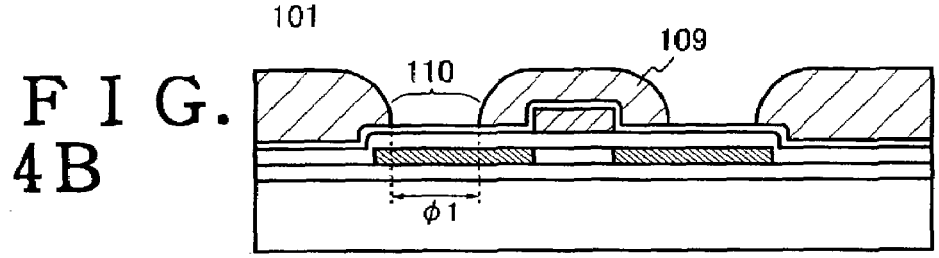
Figure 4C:
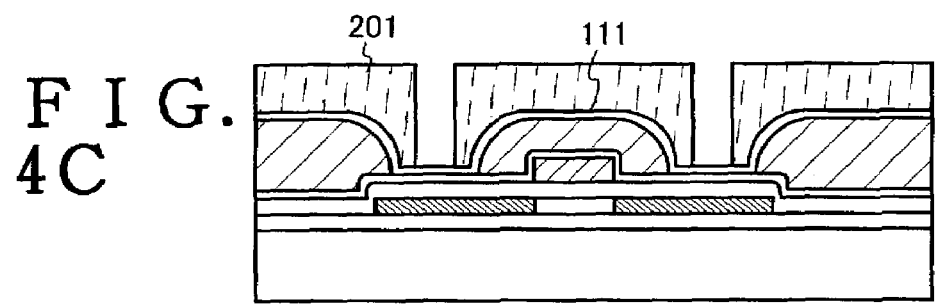
Figure 4D:
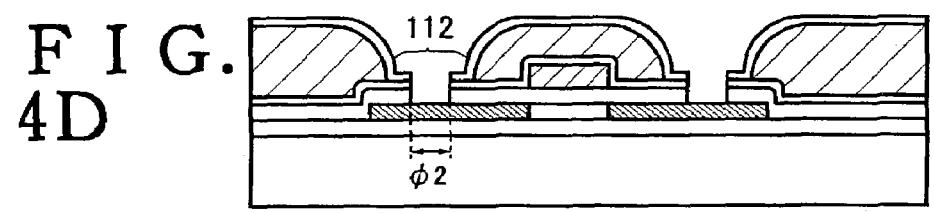
Figure 4E:
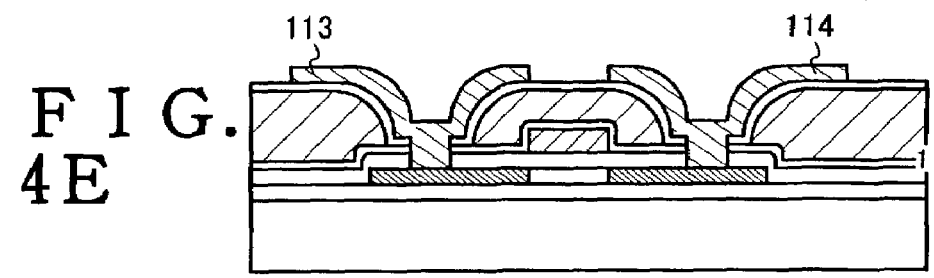
Figure 5A:
FIGS. 5A and 5B are a SEM photograph and a schematic diagram showing a sectional structure of an organic resin film.
Figure 5B:
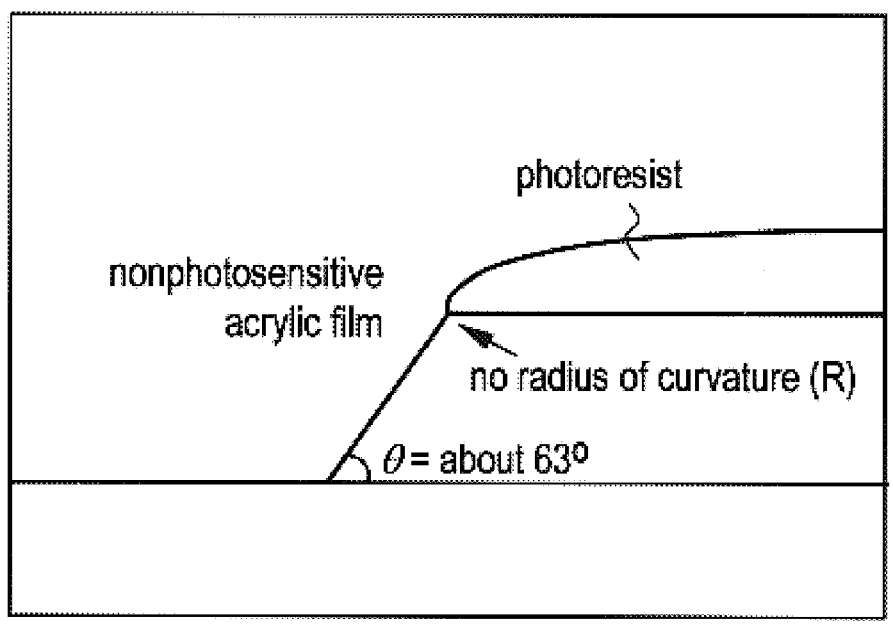
Figure 6A:
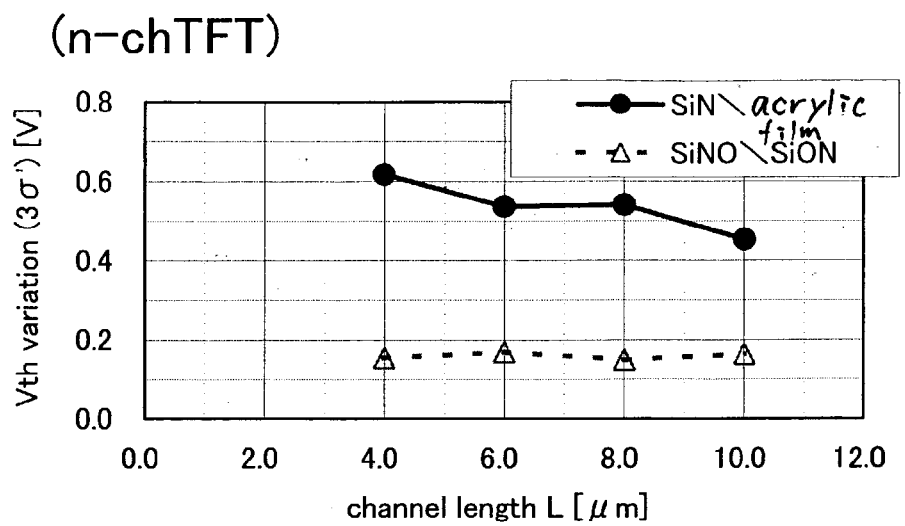
FIGS. 6A and 6B are diagrams showing a dispersion of threshold voltage.
Figure 6B:
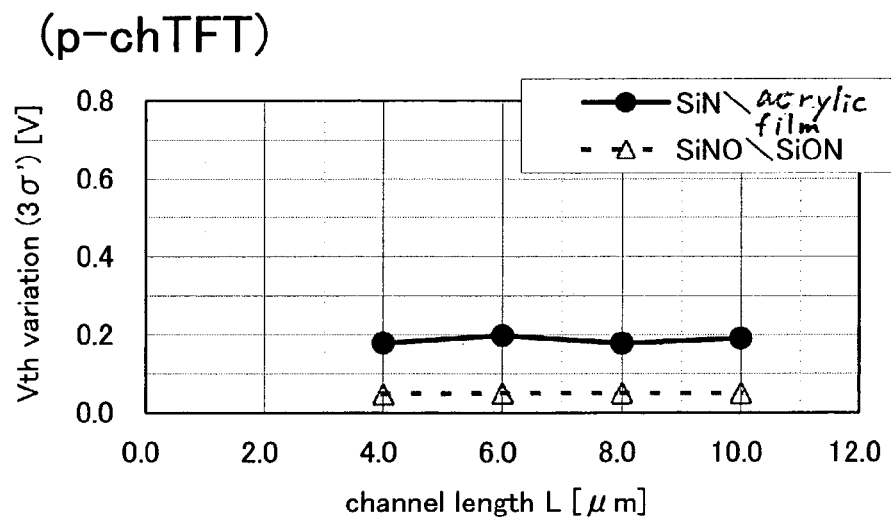
Figure 7A:
FIGS. 7A and 7B are a SEM photograph and a schematic diagram showing a sectional structure of an organic resin film.
Figure 7B:
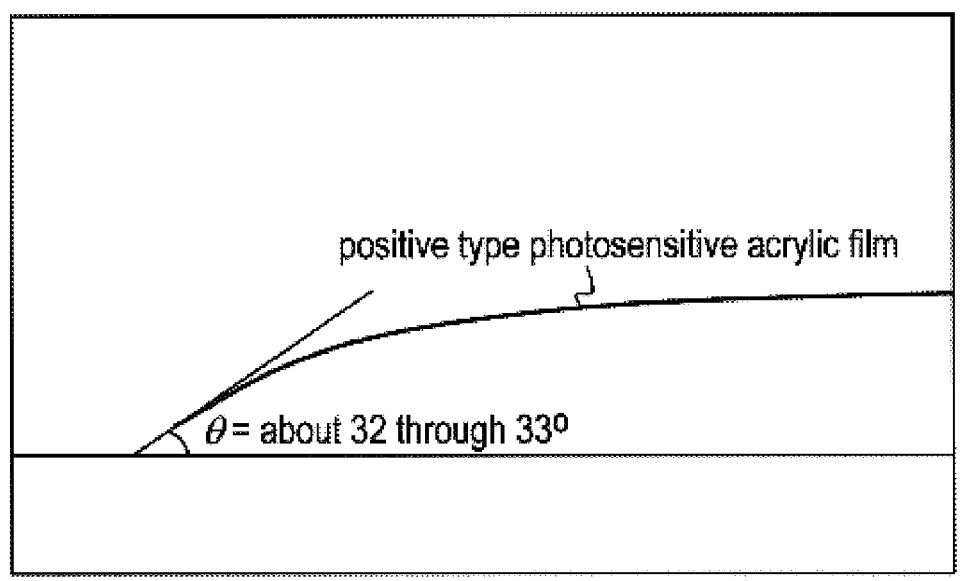
Figure 8A:
FIGS. 8A and 8B are a SEM photograph and a schematic diagram showing a sectional structure of an organic resin film.
Figure 8B:
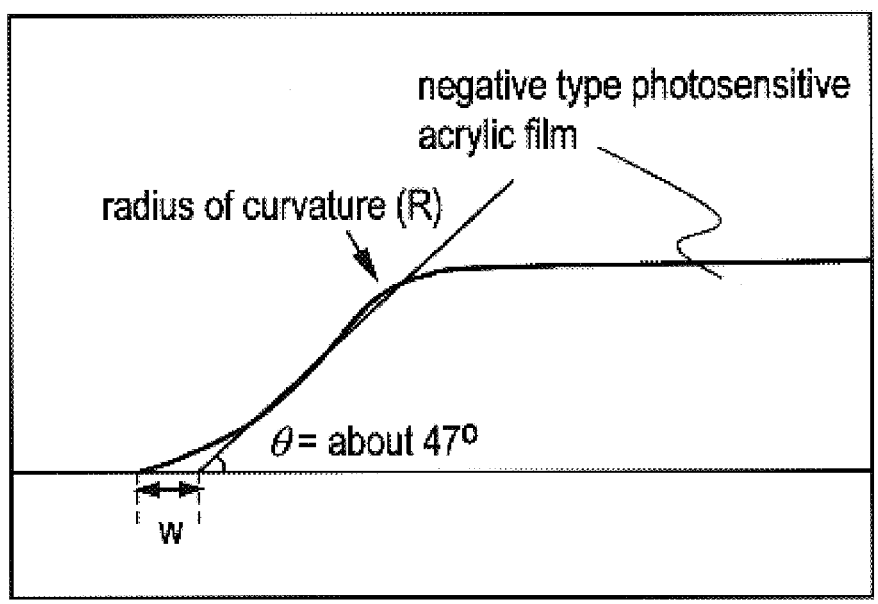
Figure 9A:
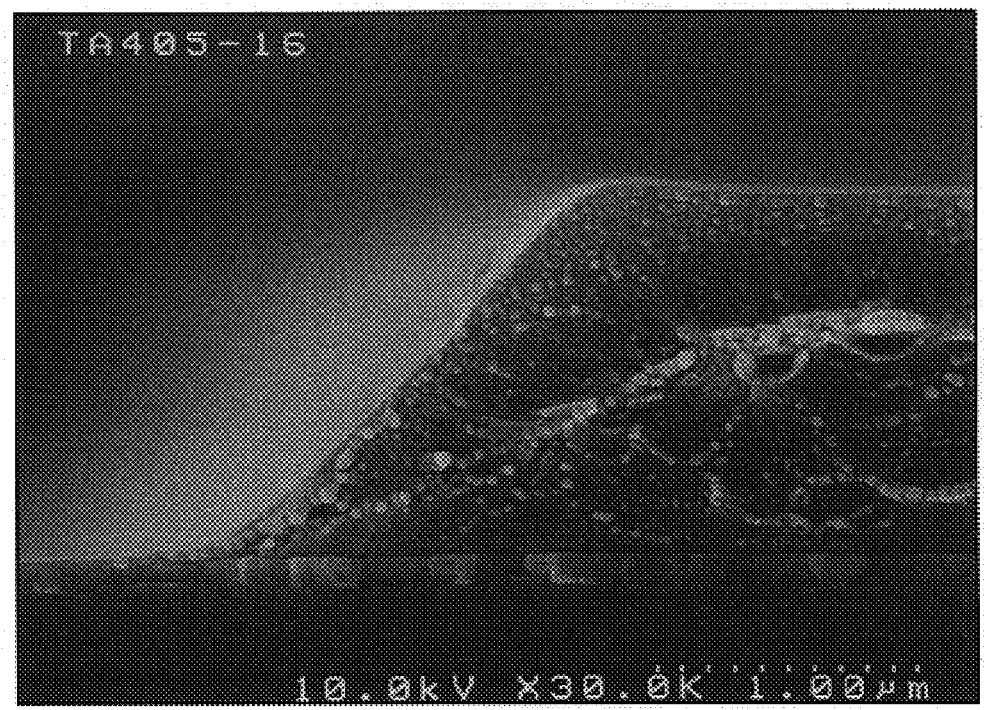
FIGS. 9A and 9B are a SEM photograph and a schematic diagram showing a sectional structure of an organic resin film.
Figure 9B:
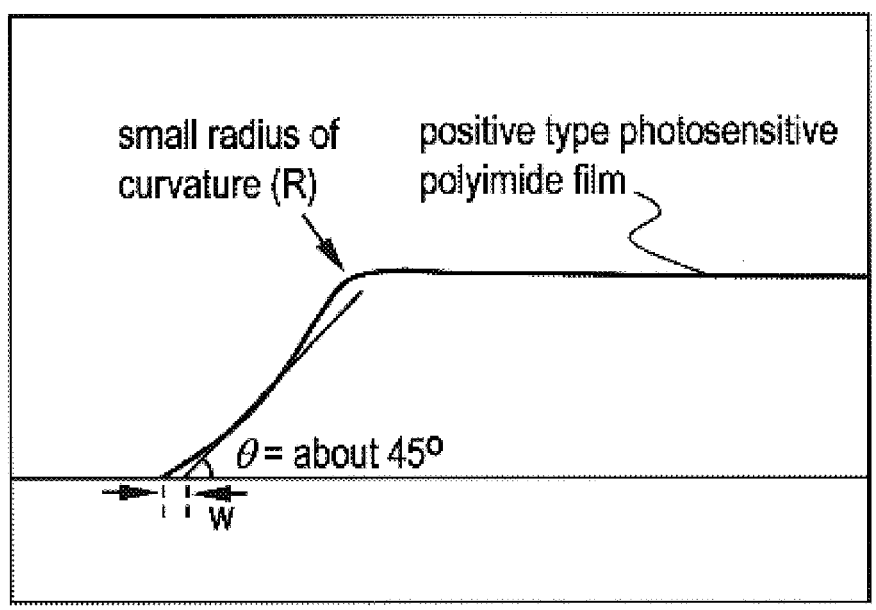
Figure 10A:
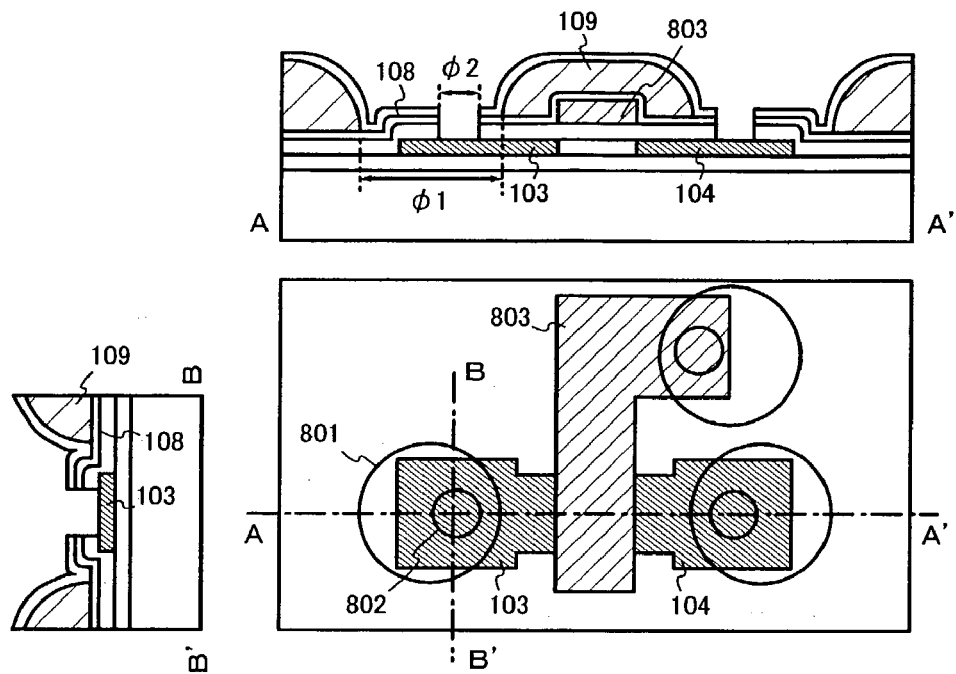
FIGS. 10A and 10B are diagrams showing a structure of a thin film transistor.
Figure 10B:
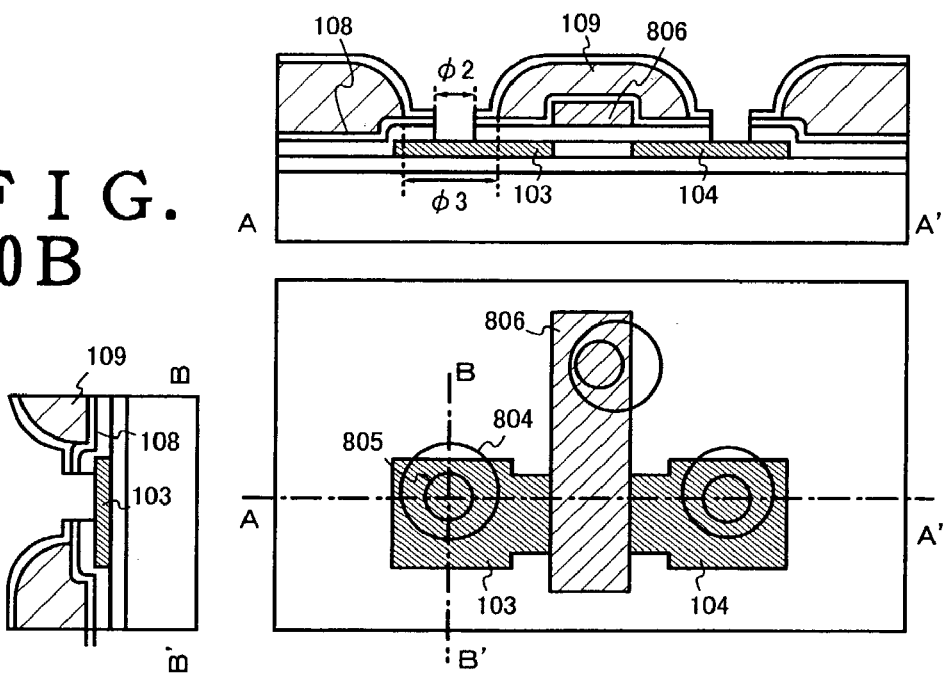

According to the embodiment, an explanation will be given of an example of making a position of forming the first opening portion 110 in FIGS. 3A and 3B differ therefrom in reference to FIGS. 10A and 10B. Further, FIGS. 10A and 10B show a sectional structure at a time point of forming a second opening portion. Further, notations used in FIGS. 3A and 3B are referred as necessary.

In FIG. 10A, notation 801 designates a first opening portion having a diameter φ1 and notation 802 designates a second opening portion having a diameter φ2. A characteristic of FIG. 10A resides in that the first opening portion 801 is provided to extrude from an end portion of the source region 103. The photosensitive organic resin film 109 can be formed at a position as shown by the embodiment since progress of etching is stopped by constituting an etching stopper by the first passivation film 108. Further, the structure can be constituted similarly not only at a portion in contact with the source region or the drain region but also a portion in contact with the gate electrode 107.

Further, in FIG. 10B, notation 803 designates a first opening portion having a diameter φ3 and notation 804 designates a second opening portion having a diameter φ2. A characteristic of FIG. 10B also resides in that the first opening portion 803 is provided to extrude from a side end portion of the source region 103. Also in this case, progress of etching the photosensitive organic resin film 109 is stopped by constituting the etching stopper by the first passivation film 108. Further, the contact structure can be constituted similarly not only at a portion in contact with the source region or the drain region but also at a portion in contact with the gate electrode 107.

As described above, since there is present an inorganic insulating film which can constitute the etching stopper under the photosensitive organic resin film used as the interlayer insulating film, even when the diameter of the first opening portion is increased, no problem is posed, which is very useful in view of the fact that design margin in forming a contact hole can be widened.

Embodiment 2

According to the embodiment, there is shown an example of using a bottom gate type thin film transistor (specifically, inverse stagger type TFT) as a thin film transistor in embodying the first aspect of the invention or the second aspect of the invention, that is, an example of using an inverse stagger type TFT as a switching TFT and a driving TFT in embodying the light emitting device shown in FIGS. 1A and 1B.

Figure 11:
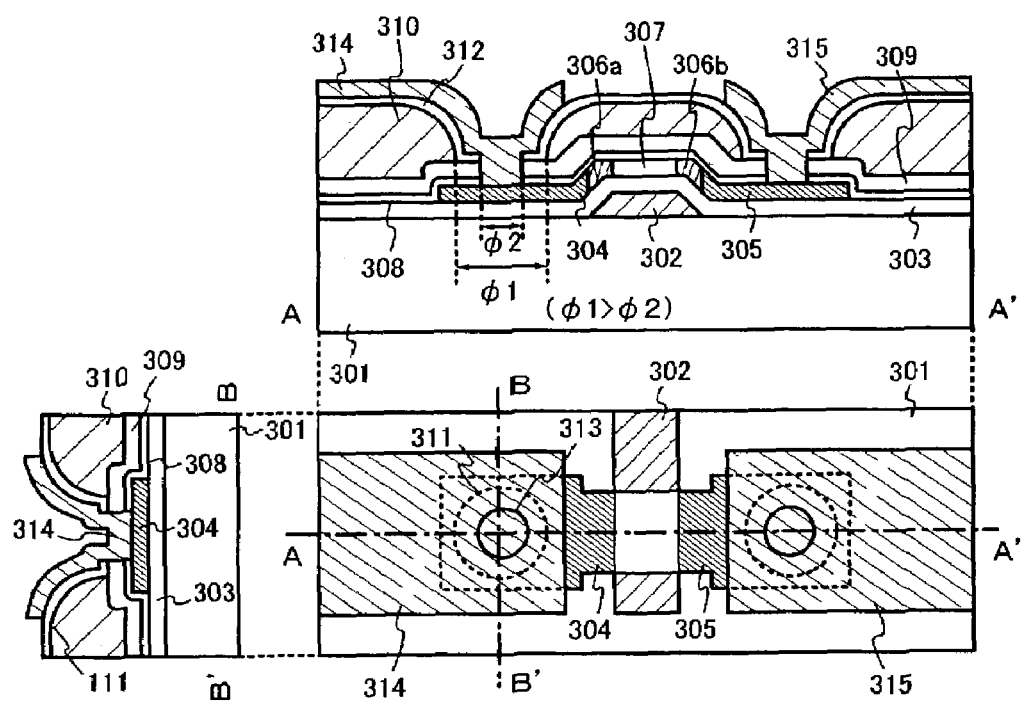
FIG. 11 is a diagram showing a structure of a thin film transistor.

The embodiment will be explained in reference to FIG. 11. In FIG. 11A, notation 301 designates a substrate, notation 302 designates a gate electrode, notation 303 designates a gate insulating film, notation 304 designates a source region, notation 305 designates a drain region, notations 306a and 306b designate LDD regions, notation 307 designates a channel forming region and these are constituted by using a semiconductor film provided above the gate insulating film provided to cover the gate electrode 302. Further, notations 308 and 309 designate inorganic insulating films and according to the embodiment, notation 308 designates a silicon oxide film and notation 309 designates a silicon nitride film. The silicon nitride film 309 functions as a first passivation film and the silicon oxide film 308 functions as a buffer layer between the semiconductor layer constituting a lower layer and the first passivation film 309 comprising silicon nitride. Heretofore, there is shown a structure of a publicly-known thin film transistor and all of publicly-known materials can be used for materials of respective portions thereof.

Next, above the first passivation film 309, as an interlayer insulating film 310, a photosensitive organic resin film, specifically, a positive type photosensitive acrylic film is provided and the photosensitive organic resin film 310 is provided with a first opening portion (designated by diameter φ1) 311. Further, a second passivation film 312 comprising an inorganic insulating film is provided to cover an upper face of the photosensitive organic resin film 310 and an inner wall face of the first opening portion 311 and the second passivation film 312 is provided with a second opening portion (designated by diameter φ2) 313 at a bottom face of the first opening portion 311. Further, notation 314 designates a source electrode and notation 315 designates a drain electrode.

Also in the embodiment, similar to the thin film transistor of FIG. 3A and FIG. 3B, as the first passivation film 309 and the second passivation film 312, a silicon nitride film, a silicon nitrooxide film, a silicon oxynitride film, an aluminum nitride film, an aluminum nitrooxide film or an aluminum oxynitride film can be used. Further, a laminated film including at least portions of the films can be constituted. Further, the diameter φ1 may be 2 through 10 µm (preferably, 3 through 5 µm), the diameter φ₂ may be 1 through 5 µm (preferably, 2 through 3 µm) and a relationship of (φ1>φ2 may be satisfied. Further, although an explanation of the sectional shape of the first opening portion 311 will be omitted here since a detailed explanation thereof is given in the summary of the invention, it is preferable that the inner wall face constitutes a smooth curved face and is provided with a radius of curvature continuously changed. Specifically, when an attention is paid to radii of curvature R1, R2, R3 at three points successively, it is preferable that a relationship among the radii of curvature becomes R1<R2<R3 and numerical values thereof are 3 through 30 µm (representatively, 10 through 15 µm). Further, at the bottom face of the first opening portion 311, an angle made by the photosensitive organic resin film 310 and the first passivation film 309 (contact angle θ) preferably falls in a range of 30°<θ<65° (representatively, 40°<θ<50°).

As described above, in embodying the first aspect of the invention or the second aspect of the invention, it is not necessary to limit a structure of the thin film transistor only to the top gate type or only to the bottom gate type and the invention is applicable to all structures of thin film transistors. Further, the invention is not limited to thin film transistors but is applicable to a transistor of an MOS structure fabricated by forming a well on a silicon wafer.

Embodiment 3

According to the embodiment, an explanation will be given of an example in which the first aspect of the invention or the second aspect of the invention is applied to a liquid crystal display device. In FIGS. 12A, 12B, 12C and 12D, FIG. 12A is a top view at a pixel of a liquid crystal display device (however, up to forming a pixel electrode), FIG. 12B is a circuit diagram thereof and FIGS. 12C and 12D are sectional views taken along a line A-A' and a line B-B' of FIG. 12A.

Figure 2A:
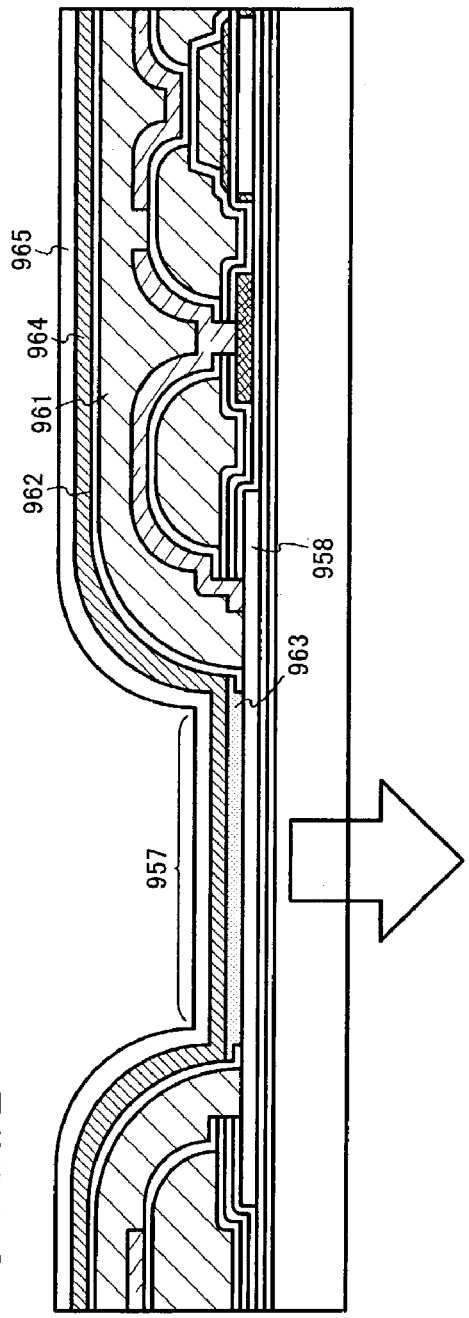
FIGS. 2A and 2B are views showing a sectional structure of the light emitting device.
Figure 2B:
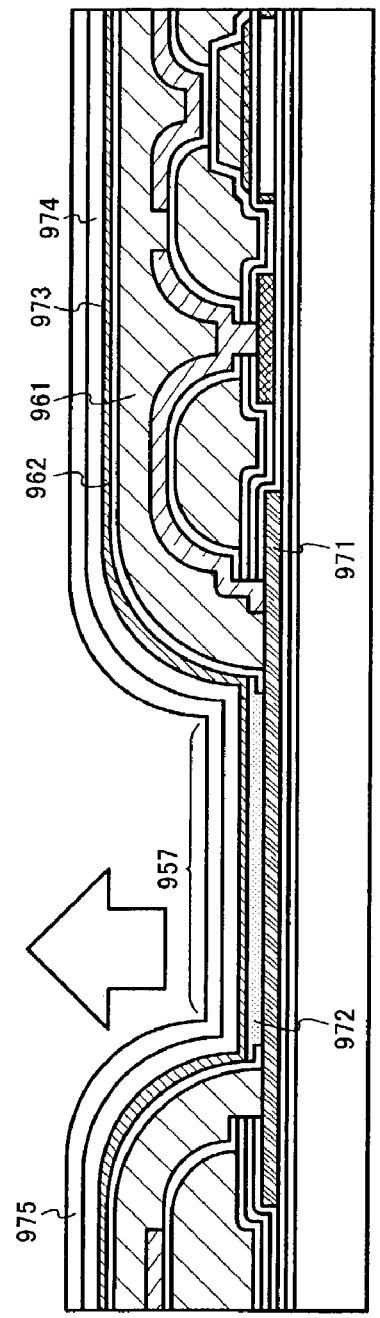

As shown by FIGS. 12A and 12B, a display portion of the liquid crystal display device includes a plurality of pixels surrounded by gate wiring 851 and a data wiring 852 in a matrix arrangement and each of the pixels is provided with TFT functioning as a switching element (hereinafter, referred to as switching TFT) 853, a capacitor portion 854 and a liquid crystal element 855. Further, although the liquid crystal element 855 is not illustrated in FIG. 2A, the liquid crystal element 855 can be formed by providing a liquid crystal layer above a pixel electrode 857. Although in the circuit diagram shown by FIG. 12B, both of the capacitor portion 854 and the liquid crystal element 855 are connected to a constant potential line 856, it is not necessary to maintain the both at the same potential but one of them may be maintained at common potential and other thereof may be maintained at ground potential. Further, although according to the embodiment, an n-channel type TFT having a multigate structure is used as the switching TFT 853, a p-channel type TFT may be used therefor. Further, layout of switching TFT may pertinently be set by a person of embodying the invention.

The switching TFT 853 and the capacitor portion 854 are shown in the sectional diagram of FIG. 12C. Notation 800 designates a substrate and a glass substrate, a ceramic substrate, a quartz substrate, a silicon substrate or a plastic substrate (including plastic film) can be used therefor. Further, notation 801 designates a silicon nitrooxide film and notation 802 designates a silicon oxynitride film which are laminated to function as a base film. Naturally, it is not necessary to limit the films to these materials.

The pixel electrode 857 formed by patterning an oxide conductive film is previously formed above the silicon oxynitride film 802. That is, by previously providing the pixel electrode 857 before forming a thin film transistor, the number of the laminated layers of a total of the circuit can be reduced. Further, although an oxide conductive film which is transparent with respect to visible light (representatively, ITO film) is used as the pixel electrode 857, the film is not limited thereto but other oxide conductive film may be used. Further, a silicon oxynitride film 803 is provided above the pixel electrode 857. It is preferable that an insulating film having a material the same as that of a gate insulating film formed later or having a high selection ratio with an activation layer is used similar to the case of second aspect of the invention.

Further, an activation layer of the switching TFT 853 is provided above the silicon oxynitride film 803 and the activation layer includes a source region 804, a drain region 805, LDD regions 806a through 806d and channel forming regions 807a and 807b, and the two channel forming regions and the four formed LDD regions are provided between the source region 804 and the drain region 805.

Further, the activation layer of the switching TFT 853 is covered by a gate insulating film 808, and gate electrodes 809a and 809b and gate electrodes 810a and 810b are provided thereabove. Further, as the gate electrodes 809a and 810a, tantalum nitride films are used and as the gate electrodes 809b and 810b, tungsten films are used. The metal films are provided with high selection ratios with each other and therefore, a structure as shown by FIG. 12B can be constituted by selecting etching conditions. With regard to the etching conditions, JP-A-2001-313397 by the applicant may be referred to.

Further, as a first passivation film 811 covering the gate electrodes, a silicon nitride film or a silicon nitrooxide film is provided and a photosensitive organic resin film 812 (according to the embodiment, a positive type photosensitive acrylic film is used) is provided thereabove. Further, the photosensitive organic resin film 812 is provided with a second passivation film 813 to cover a first opening portion (refer to FIG. 3B) and a second opening portion (refer to FIG. 3B) is provided at a bottom face of the first opening portion. According to the embodiment, as the second passivation film 813, a silicon nitride film or a silicon nitrooxide film is used. Naturally, other insulating nitride film of an aluminum nitride film or an aluminum nitrooxide film can also be used.

Further, the data wiring 852 is connected to the source region 804 via the first opening portion and the drain wiring 815 is connected to the drain region 805 via the second opening portion. The drain wiring 815 is used as an electrode constituting a storage capacitor at the capacitor portion and electrically connected to the pixel electrode 857. Further, although according to the embodiment, an oxide conductive film which is transparent with respect to visible light (representatively, ITO film) is used as the pixel electrode 857, the invention is not limited thereto. Further, the data wiring 852 and the drain wiring 815 may use a structure interposing a wiring whose major component is a metal having low resistance of aluminum or copper by other metal films or an alloy film of these metals.

The drain wiring 815 is opposed to a capacitor wiring 816 formed simultaneously with the gate electrode (that is, formed at a face the same as that of the gate electrode) via the first passivation film 811 and the second passivation film 813 and forms a storage capacitor 854a. Further, the capacitor wiring 816 is opposed to a semiconductor film 817 via the gate insulating film 808 and forms a storage capacitor 854b. The semiconductor film 817 is electrically connected to the drain region 805 and therefore, functions as electrode by applying constant voltage to the capacitor wiring 816 in this way, the capacitor portion 854 is constructed by a constitution connected in parallel with the storage capacitors 854a and 854b and therefore, large capacitance is provided by a very small area. Further, particularly the storage capacitor 854a can ensure large capacitance since the silicon nitride film having a high specific inductive capacity is used as a dielectric body.

FIGS. 13A and 13B show an example of actually forming up to a liquid crystal element in the liquid crystal display device having the above-described pixel constitution. FIG. 13A is a view in correspondence with the section shown in FIG. 12C, showing a state of forming the liquid crystal element 855 above the pixel electrode 857. A spacer 821 comprising an organic resin is provided above the drain wiring 815 and an alignment film 822 is provided from thereabove. An order of forming the spacer 821 and the alignment film 822 may be reversed. Further, a light blocking film 824 comprising a metal film, an opposed electrode 825 comprising a conductive oxide film and an alignment film 826 are provided on other substrate (opposed substrate) 823 and the alignment film 822 and the alignment film 826 are pasted together to be opposed to each other by using a seal member (not illustrated). Further, a liquid crystal 827 is injected from a liquid crystal injection port provided at the seal member and the liquid crystal injection port is sealed to thereby finish the liquid crystal display device. Further, general cell integrating steps of liquid cell may be applied to steps after forming the spacer 821 and therefore, a detailed explanation thereof will not be given particularly.

Further, although as rubbing treatment of the alignment film 822, general rubbing treatment may be carried out, or rubbingless technology may be used, when a diamond-like carbon (DLC) film is used as the third base film 803 in FIG. 12C, in forming the second opening portion above the pixel electrode 857, only the DLC film can selectively made to remain and therefore, a technology of achieving alignment property can be used by irradiating laser to the DLC film.

When the structure shown in FIG. 13A is constituted, light is incident on the side of the opposed substrate 823, modulated by the liquid crystal 827 and emitted from the side of the substrate 801. At this occasion, transmitting light transmits through the photosensitive organic resin film 812 used for the interlayer insulating film and therefore, it is necessary to make the photosensitive organic resin film 812 sufficiently transparent by sufficiently carrying out decoloring treatment.

Further, when the structure shown in FIG. 13A is constituted, the structure is useful in that a height of the spacer 821 needs not to be heightened more than necessary. That is, although when a normal TN liquid crystal is used, a cell gap is around 0.4 µm and in that case, also the height of the spacer needs to be around 4 µm, when the structure of the embodiment is constituted, the cell gap is constituted by a height constituted by adding the height of the spacer to a height derived from the thin film transistor (about 1.5 through 2 µm). Therefore, the height of the spacer 821 per se is sufficiently about 2.0 through 2.5 µm, which is a range capable of being formed by coating by a sufficiently uniform film thickness. Further, even when light transmitting through the display region (region occupied by the pixel electrode 857) is scattered to the side of the thin film transistor, as is apparent from FIGS. 12A and 12B and FIG. 13A, the drain wiring 815 is provided to cover a wall face of the photosensitive organic resin film 812 and therefore, an advantage of functioning as the light blocking film to scattering of light from a horizontal direction is achieved. Further, a distance for light transmitting through the display region of the pixel to transmit through the insulating film is shortened and therefore, optical loss by scattering at an interface can be restrained.

Next, FIG. 13B shows an example of utilizing a drain wiring 831 comprising a metal film having a reflecting property as it is in place of the pixel electrode 857 and as the metal film having the reflecting property, an aluminum film (including aluminum alloy film) or a conductive film having at least a silver thin film at a surface thereof can be used. An explanation of other portions attached with notations the same as those of FIG. 13A will be omitted. When the structure shown by FIG. 13B is constituted, light is incident on the side of the opposed substrate 823, modulated by the liquid crystal 827 and emitted again from the side of the opposed substrate 823. Also in this case, an effect similar to that in the case of FIG. 13A is achieved.

Figure 22:
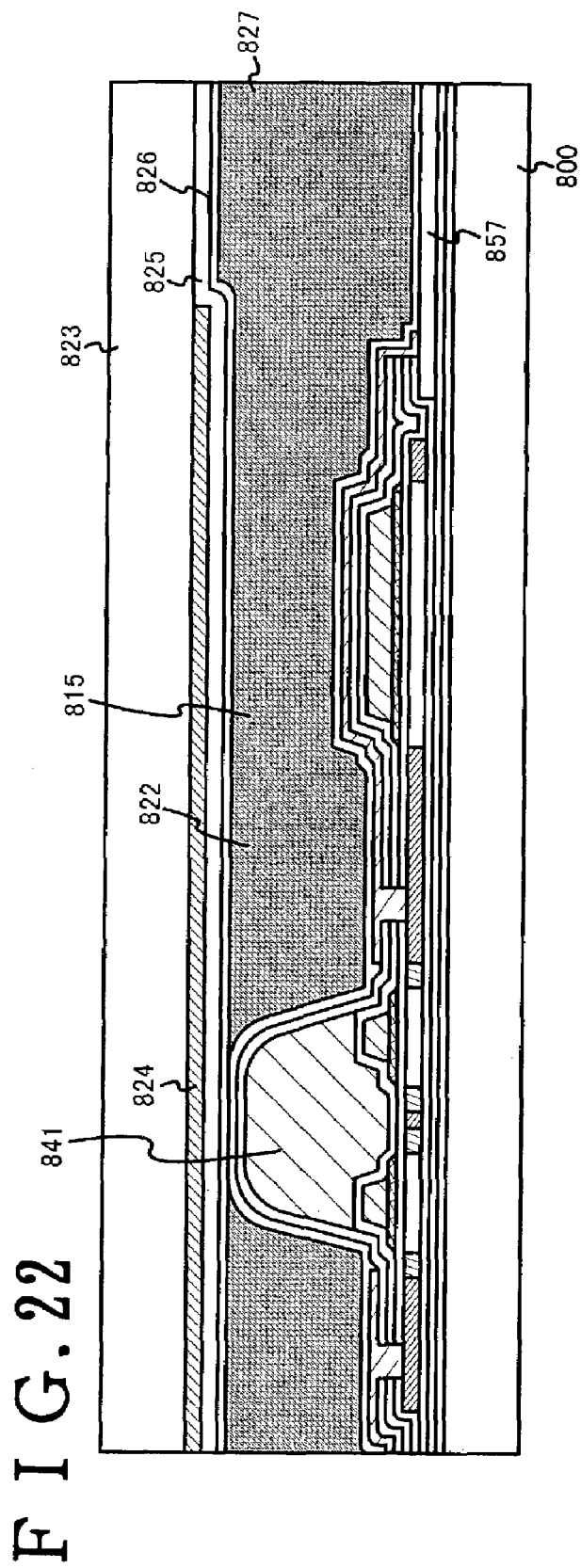
FIG. 22 is a view showing a sectional structure of a liquid crystal display device.

Further, by thickly forming the photosensitive organic resin film as shown by FIG. 22, a structure serving also as a spacer can be constituted. In FIG. 22, notation 841 designates a photosensitive organic resin film formed to serve also as a spacer. In the case of the structure as shown by FIG. 22, it is not necessary to provide the spacer 821 as shown by FIGS. 13A and 13B and therefore, the number of masks can be reduced by one sheet (a mask for forming a spacer), further, a step of forming the spacer can be omitted. Further, since FIG. 22 shows the structure serving also as the spacer by thickly forming the photosensitive organic resin film in FIG. 13A, other than the photosensitive organic resin film and the spacer is constituted by a similar structure and therefore, portions the same as those of FIG. 13A are designated by the same numerals.

Embodiment 4

Figure 14A:
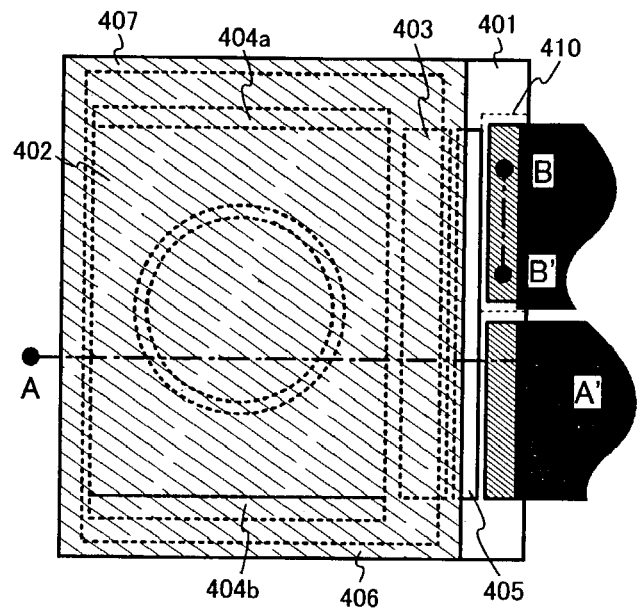
FIGS. 14A, 14B, 14C and 14D are views showing an outlook constitution of a light emitting device.
Figure 14B:
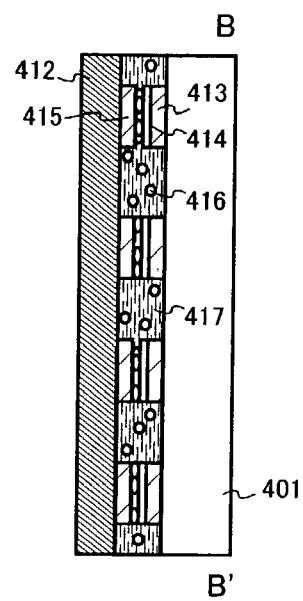
Figure 14C:
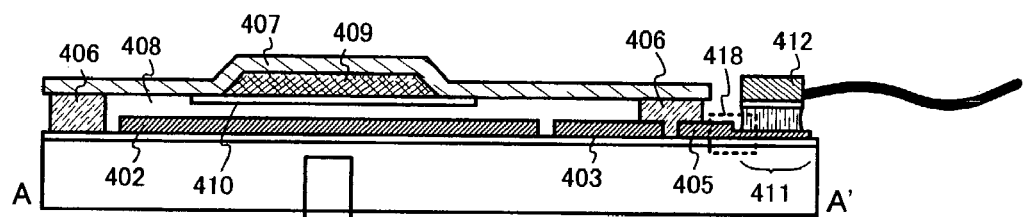

In this embodiment, a structure of the entire light emitting device shown in FIGS. 1A to 1D will be described using FIGS. 14A to 14D. FIG. 14A is a plan view of a light emitting device produced by sealing an element substrate in which thin film transistors are formed with a sealing material. FIG. 14B is a cross sectional view along a line B-B' in FIG. 14A. FIG. 14C is a cross sectional view along a line A-A' in FIG. 14A.

A pixel portion (display portion) 402, a data line driver circuit 403, gate line driver circuits 404a and 404b, and a protective circuit 405, which are provided to surround the pixel portion 402, are located on a substrate 401, and a seal material 406 is provided to surround them. The structure of the pixel portion 402 preferably refers to FIGS. 1A-D and its description. As the seal material 406, a glass material, a metallic material (typically, a stainless material), a ceramic material, or a plastic material (including a plastic film) can be used. As shown in FIGS. 1A-D, it can be also sealed with only an insulating film. In addition, it is necessary to use a transparent material according to a radiation direction of light from an EL element.

The seal material 406 may be provided to partially overlap with the data line driver circuit 403, the gate line driver circuits 404a and 404b, and the protective circuit 405. A sealing material 407 is provided using the seal material 406, so that a closed space 408 is produced by the substrate 401, the seal material 406, and the sealing material 407. A hygroscopic agent (barium oxide, calcium oxide, or the like) 409 is provided in advance in a concave portion of the sealing material 407, so that it has a function of absorbing moisture, oxygen, and the like to keep an atmosphere clean in an inner portion of the above closed space 408, thereby suppressing the deterioration of an EL layer. The concave portion is covered with a cover material 410 with a fine mesh shape. The cover material 410 allows air and moisture to pass therethrough but not the hygroscopic agent 409. Note that the closed space 408 is preferably filled with a noble gas such as nitrogen or argon, and can be also filled with a resin or a liquid if it is inert.

Also, an input terminal portion 411 for transmitting signals to the data line driver circuit 403 and the gate line driver circuits 404a and 404b is provided on the substrate 401. Data signals such as video signals are transferred to the input terminal portion 411 through a FPC (flexible printed circuit) 412. With respect to a cross section of the input terminal portion 411, as shown in FIG. 14B, an input wiring having a structure in which an oxide conductive film 414 is laminated on a wiring 413 formed together with a gate wiring or a data wiring is electrically connected with a wiring 415 provided in the FPC 412 side through a resin 417 to which conductors 416 are dispersed. Note that a spherical polymer compound for which plating processing using gold or silver is conducted is preferably used for the conductors 416.

Figure 14D:
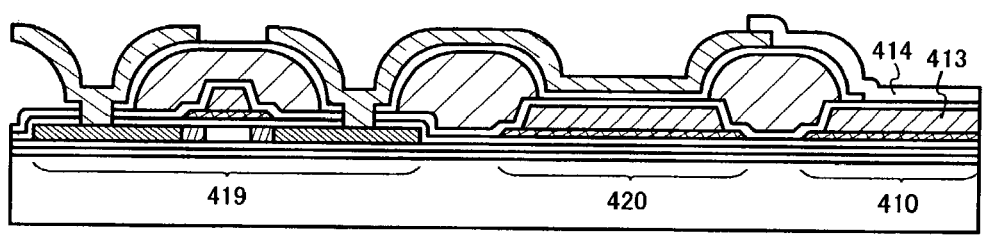

Also, an enlarged view of a region 418 surrounded by a dot line in FIG. 14C is shown in FIG. 14D. The protective circuit 405 is preferably composed by combining a thin film transistor 419 and a capacitor 420, and any known structure may be used therefor. The present invention has such a feature that the formation of the capacitor is possible without increasing the number of photolithography steps together with the improvement of contact holes. In this embodiment, the capacitor 420 is formed utilizing the feature. Note that the structure of the thin film transistor 419 and that of the capacitor 420 can be understood if FIGS. 1A-D and description thereof are referred to, and therefore the description is omitted here.

In this embodiment, the protective circuit 405 is provided between the input terminal portion 411 and the data line driver circuit 403. When an electrostatic signal such as an unexpected pulse signal is inputted therebetween, the protective circuit releases the pulse signal to the outside. At this time, first, a high voltage signal which is instantaneously inputted can be dulled by the capacitor 420, and other high voltages can be released to the outside through a circuit composed of a thin film transistor and a thin film diode. Of course, the protective circuit may be provided in other locations, for example, a location between the pixel portion 402 and the data line driver circuit 403 or locations between the pixel portion 402 and the gate line driver circuits 404a and 404b.

As described above, according to this embodiment, when the present invention is carried out, an example in which the capacitor used for the protective circuit for electrostatic measures and the like which is provided in the input terminal portion is simultaneously formed is indicated. This embodiment can be carried out by being combined with any structure of Embodiments 1 and 2.

Embodiment 5

Figure 15:
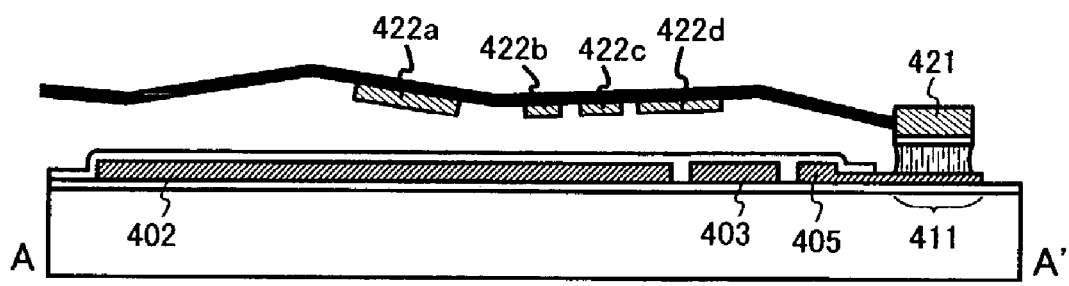
FIG. 15 is a diagram showing an outlook constitution of a light emitting device.

The embodiment shows an example of a light emitting device having a constitution different from that of Embodiment 4. FIG. 15 is used for the explanation. FIG. 15 is a sectional view in correspondence with FIG. 14C, the pixel portion 402, the data line driving circuit 403 and the protecting circuit 405 are provided above the substrate 401 and the input terminal portion 411 is provided above an extended line of the circuits. The pixel portion 402, the data line driving circuit 403 and the protecting circuit 405 seal the El element by using a protective film 421 similar to the light emitting device shown in FIGS. 1A, 1B, 1C and 1D and is constituted very thinly.

Further, according to the embodiment, electric connection to an outside driving circuit is ensured by using TCP (tape carrier package) 422. TCP 422 is constructed by a constitution provided with IC chips 422a though 422d at a TAB (tape automated bonding) tape portion and adhered with TCP 422 in a direction of disposing the IC chips 422a through 422d above the substrate 401. Therefore, a thickness of the light emitting device can be made to be very thin and by using the light emitting device at a display portion, an electric apparatus excellent in portability can be provided. Further, when a flexible substrate (representatively, plastic film) is used as a substrate, a flexible light emitting device is provided and therefore, a flexible electric apparatus capable of being pasted on a curved face can be realized.

Further, the constitution shown in the embodiment can freely be combined with the constitutions shown in any of FIGS. 1A, 1B, 1C, 1D and the 2A and 2B and Embodiments 1 through 4.

Embodiment 6

According to the embodiment, an explanation will be given of an example of forming a thin film transistor and a storage capacitor connected to the thin film transistor by a process different from that in FIGS. 4A, 4B, 4C and 4E in reference to FIGS. 18A, 18B, 18C and 18D. First, FIG. 18A will be explained. A base film 202 is formed on a substrate 201 and a semiconductor film etched in an island-like shape is formed thereabove. Further, a gate insulating film 207 is formed, a gate electrode 208 and a capacitor electrode 209 are formed, and a source region 203 and a drain region 204 are formed self-adjustingly by using the gate electrode 208 as a mask. At this occasion, a channel forming region 205 and a semiconductor region 206 functioning as one electrode of the storage capacitor are simultaneously partitioned. When the source region 203 and the drain region 204 are formed, the source region 203 and the drain region 204 are activated by a heating treatment, a first passivation film 210 is formed and thereafter, a hydrogenating treatment is carried out by a heating treatment. A fabricating method heretofore may be carried out by using a publicly-known technology and as materials of constituting the thin film transistor, all of publicly-known materials can be used.

Next, a protective film 211 is formed above the first passivation film 210. A film thickness thereof may be selected in a range of 30 through 70 nm (preferably 45 through 55 nm). As the protective film 211, a silicon oxide film or a silicon oxynitride film is used. Further, a photosensitive organic resin film 213 (here, a positive type photosensitive acrylic film) provided with a first opening portion 212 is formed above the protective film 211. The photosensitive organic region film 213 is photosensitive and therefore, patterning can be carried out by directly exposing the film to light and can be etched by development thereof. Naturally, after etching by an etching solution, a decoloring treatment and a curing treatment of the photosensitive organic resin film 213 are carried out. Further, with regard to the decoloring treatment and the curing treatment, the explanation of FIGS. 4A, 4B, 4C, 4D and 4E may be referred to.

Next, FIG. 18B will be explained. When the first opening portion 212 is formed, the exposed protective film 211 is etched with the photosensitive organic resin film 213 as a mask. At this occasion, the first passivation film 210 functions as an etching stopper. Next, a second passivation film 214 is formed to cover an upper face of the photosensitive organic resin film 213 and an inner wall face of the first opening portion 212. The second passivation film 214 may be constituted by a material the same as that of the first passivation film 210. As described in the explanation of FIGS. 4A, 4B, 4C, 4D and 4E, it is preferable to form the second passivation film 210 by a sputtering method by high frequency wave discharge. At that occasion, as conditions therefor, the explanation of FIGS. 4A, 4B, 4C, 4D and 4E may be referred to. Further, when the second passivation film 214 is formed, a photoresist 215 is formed. The photoresist 215 is a mask for forming a second opening portion at the second passivation film 214.

Next, FIG. 18C will be explained. When the photoresist 215 is formed, the second passivation film 214, the first passivation film 210 and the gate insulating film 207 are successively etched by carrying out an etching treatment to thereby form a second opening portion 216. At this occasion, although the etching treatment may be carried out by a dry etching treatment or a wet etching treatment, in order to improve the shape of the second opening portion 216, the dry etching treatment is preferable. According to the invention, in forming the second opening portion 216, even when the dry etching treatment is carried out, the photosensitive organic resin film 213 is not directly exposed to plasma.

Next, FIG. 18D will be explained. When the second opening portion 216 is formed, a metal film is formed thereabove and patterned by etching to thereby form a source electrode 217 and a drain electrode 218. In order to form the electrodes, a titanium film, a titanium nitride film, a tungsten film (including alloy thereof), an aluminum film (including an ally thereof) or a laminated film of these may be used. Further, the drain electrode 218 is extended to overlap the capacitor electrode 209. When such a structure is constituted, a first storage capacitor 219a is formed by the semiconductor region 206, the gate insulating film 207 and the capacitor electrode 209 and a second storage capacitor 219b is constituted by the capacitor electrode 209, the first passivation film 210, the second passivation film 214 and the drain electrode 218. Therefore, since the first storage capacitor 219a and the second storage capacitor 219b can be provided in parallel, large capacitance value can be ensured by a small area. Since a dielectric body of the second storage capacitor 219b is constituted by two layers of a laminated layer structure and therefore, a probability of producing pin holes is low and a highly reliable storage capacitor can be constituted.

As described above, the thin film transistor and the storage capacitor connected to the thin film transistor having the structure shown in FIG. 18D can be provided. Further, although according to the embodiment, an explanation has been given by applying the invention to the thin film transistor having a simple structure, the embodiment is also applicable to thin film transistors of all of publicly-known structures and can freely be combined with the constitutions of any of Embodiments 1 through 5.

Embodiment 7

Examples of electronic apparatuses employing a display device of the present invention to a display portion are: a video camera; a digital camera; a goggle type display (head mounted display); a navigation system; an audio reproducing apparatus (car audio, an audio component, and the like); a laptop computer; a game machine; a portable information terminal (a mobile computer, a cellular phone, a portable game machine, an electronic book, etc.); and an image reproducing apparatus including a recording medium (specifically, an apparatus capable of processing data in a recording medium such as a Digital Versatile Disk (DVD) and having a display device that can display the image of the data). Specific examples of the electronic apparatuses are shown in FIGS. 16A to 16H.

Figure 16A:
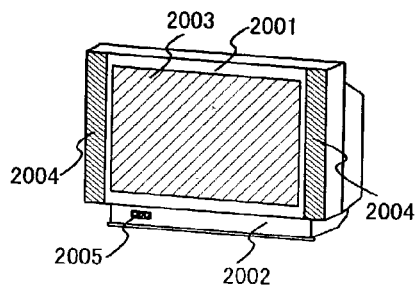
FIGS. 16A, 16B, 16C, 16D, 16E, 16F, 16G and 16H are views showing specific examples of electric apparatus.

FIG. 16A shows a television, which comprises a casing 2001, a supporting base 2002, a display unit 2003, speaker units 2004, a video input terminal 2005, etc. The present invention is applied to the display unit 2003. The term television includes every television for displaying information such as one for a personal computer, one for receiving TV broadcasting, and one for advertisement.

Figure 16B:
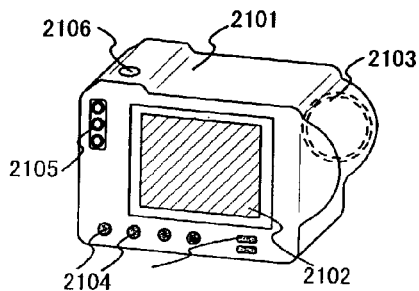

FIG. 16B shows a digital camera, which comprises a main body 2101, a display unit 2102, an image receiving unit 2103, operation keys 2104, an external connection port 2105, a shutter 2106, etc. The present invention is applied to the display unit 2102.

Figure 16C:
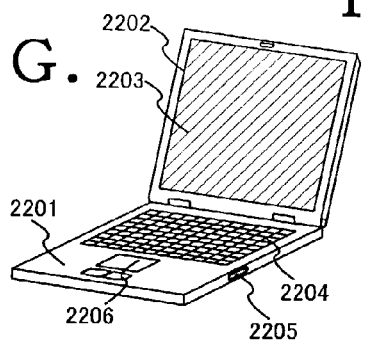

FIG. 16C shows a laptop computer, which comprises a main body 2201, a casing 2202, a display unit 2203, a keyboard 2204, an external connection port 2205, a pointing mouse 2206, etc. The present invention is applied to the display unit 2203.

Figure 16D:
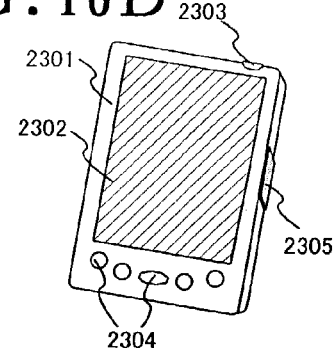

FIG. 16D shows a mobile computer, which comprises a main body 2301, a display unit 2302, a switch 2303, operation keys 2304, an infrared ray port 2305, etc. The present invention is applied to the display unit 2302.

Figure 16E:
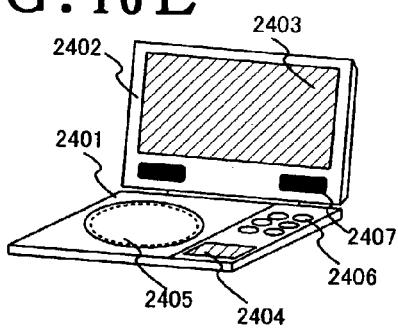

FIG. 16E shows a portable image reproducing apparatus equipped with a recording medium (a DVD player, to be specific). The apparatus comprises a main body 2401, a casing 2402, a display unit A 2403, a display unit B 2404, a recording medium (such as DVD) reading unit 2405, operation keys 2406, speaker units 2407, etc. The display unit A 2403 mainly displays image information whereas the display unit B 2404 mainly displays text information. The present invention is applied to the display units A 2403 and B 2404. The term image reproducing apparatus equipped with a recording medium includes domestic game machines.

Figure 16F:
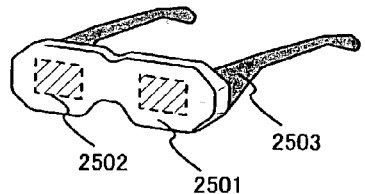

FIG. 16F shows a goggle type display (head mounted display), which comprises a main body 2501, display units 2502, and arm units 2503. The present invention is applied to the display unit 2502.

Figure 16G:
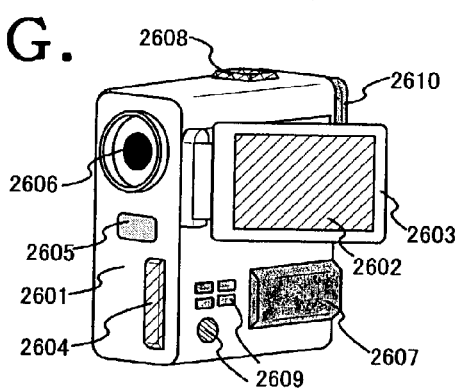

FIG. 16G shows a video camera, which comprises a main body 2601, a display unit 2602, a casing 2603, an external connection port 2604, a remote control receiving unit 2605, an image receiving unit 2606, a battery 2607, an audio input unit 2608, operation keys 2609, an eyepiece unit 2610, etc. The present invention is applied to the display portion 2602.

Figure 16H:
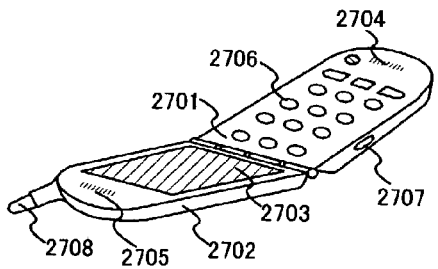
Figure 17A:
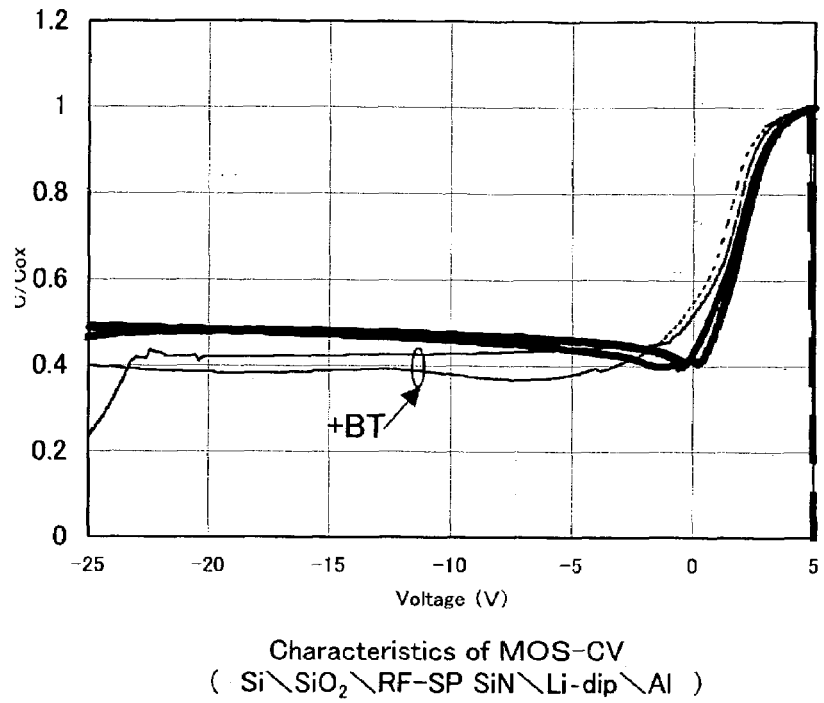
FIGS. 17A and 17B are diagrams showing a C-V characteristic of an MOS structure for making a silicon nitride film dielectric.
Figure 17B:
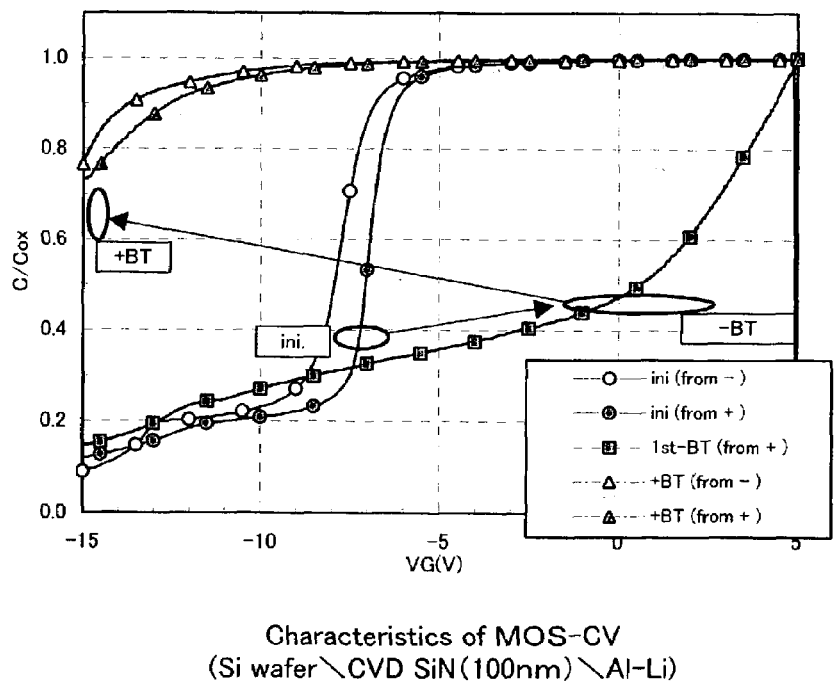
Figure 19:
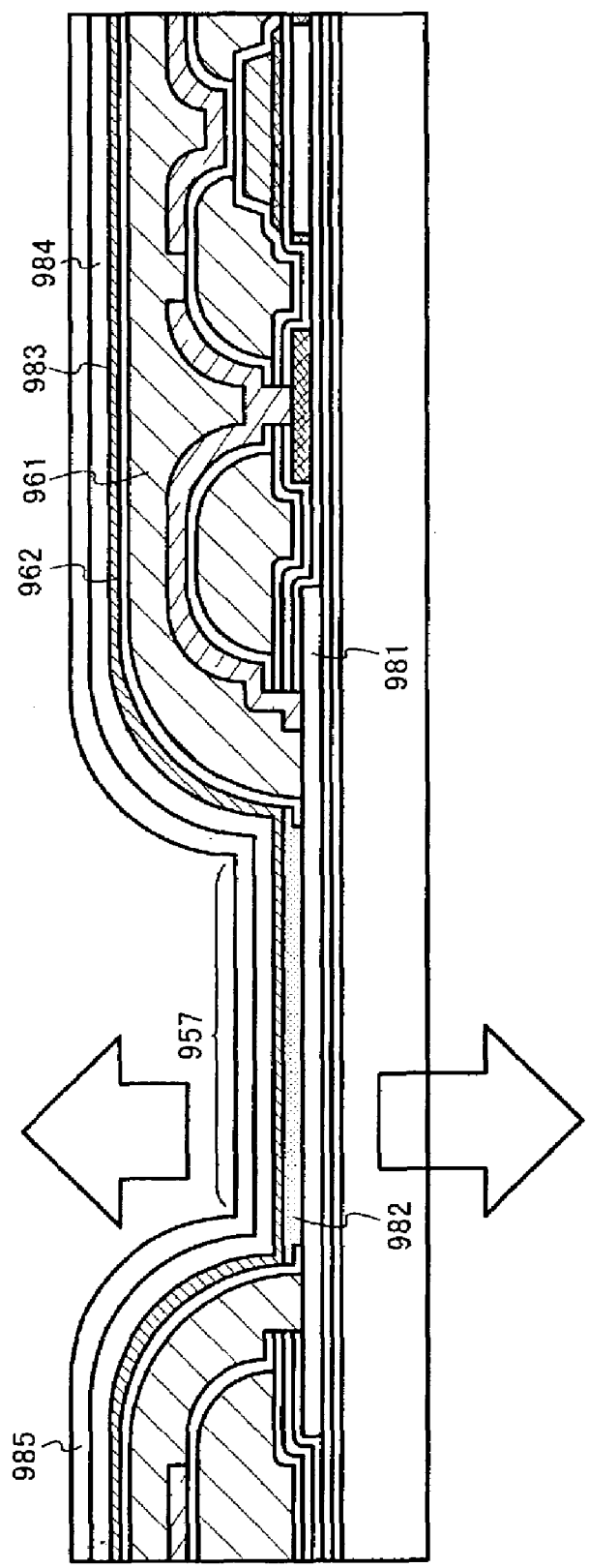
FIG. 19 is a view showing a sectional structure of a light emitting device.
Figure 20:
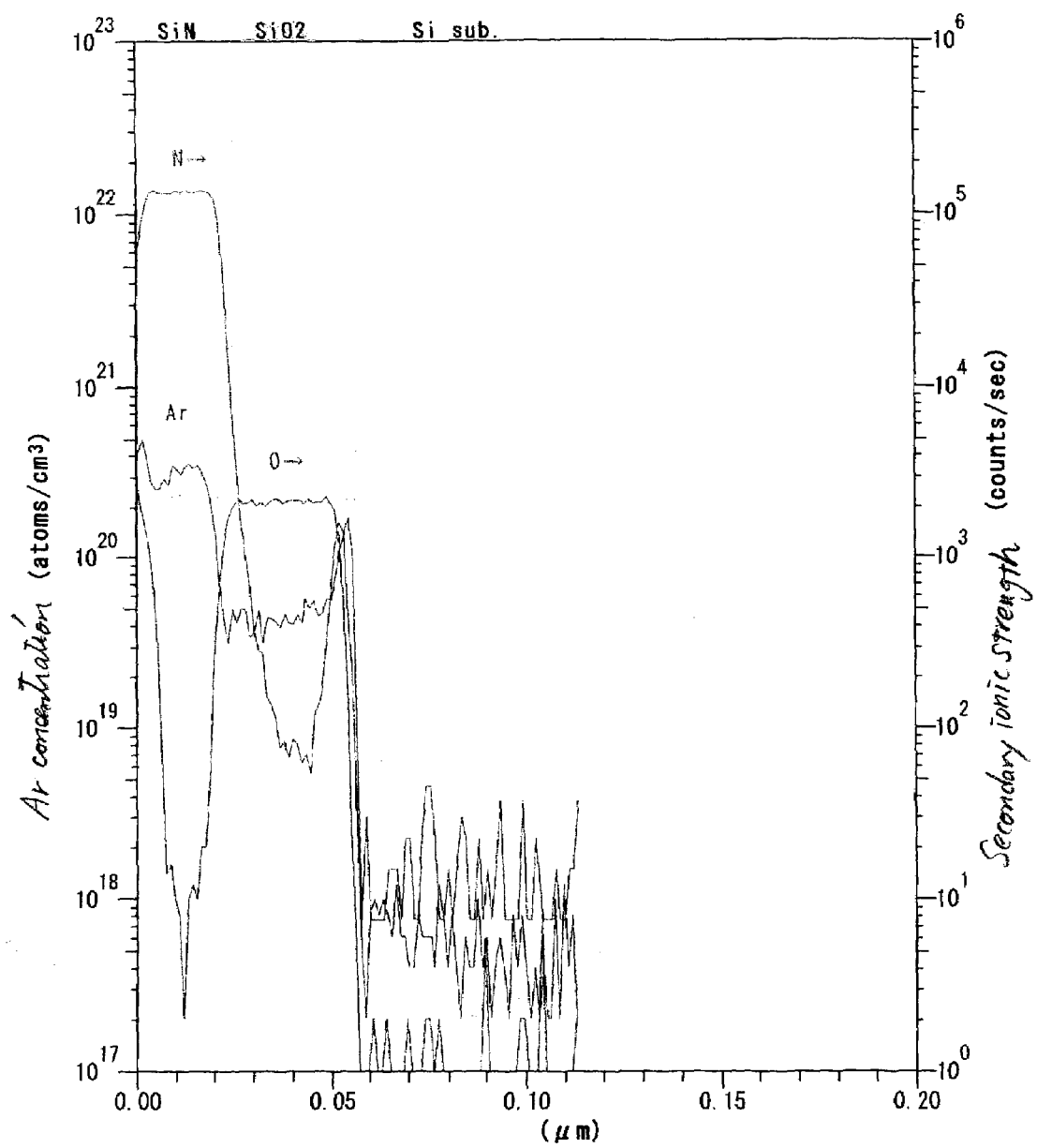
FIG. 20 shows an SIMS measurement data of a silicon nitride film.
Figure 21A:
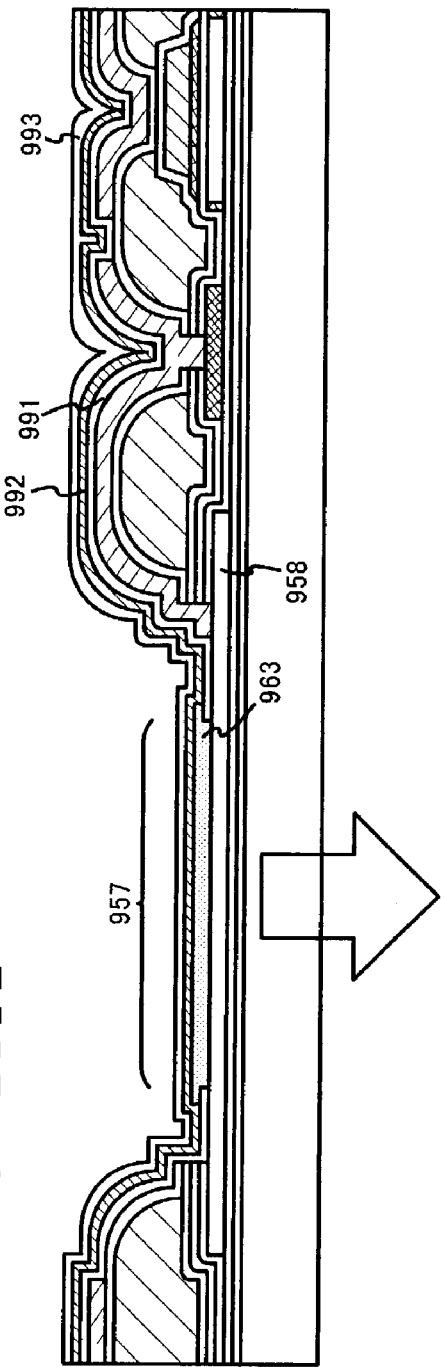
FIGS. 21A and 21B are views showing a sectional structure of an light emitting device.
Figure 21B:
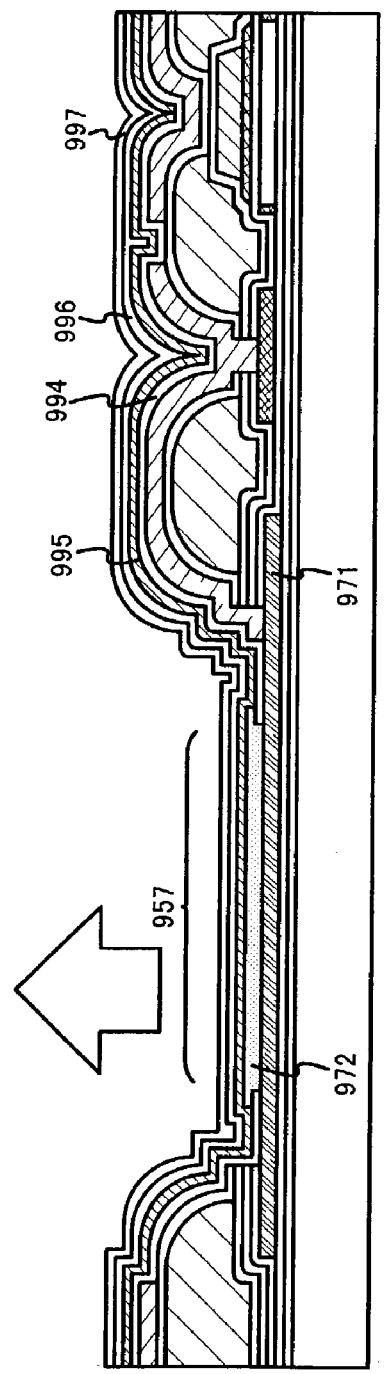

FIG. 16H shows a cellular phone, which comprises a main body 2701, a casing 2702, a display unit 2703, an audio input unit 2704, an audio output unit 2705, operation keys 2706, an external connection port 2707, an antenna 2708, etc. The present invention is applied to the display unit 2703. If the display unit 2703 displays white characters on a black background, power consumption of the cellular phone can be reduced.

As described above, the display device obtained by applying the present invention may be used as the display units of every electronic apparatuses. Since the stability of the performance of the display device can be promoted and the design margin in the circuit design can be expanded in the present invention, thus, a low-cost display device can be provided and the cost of parts for the electronic apparatus can be lowered. Also, the electronic apparatuses of this embodiment may use any structure of the display devices shown in Embodiments 1 to 6.

According to the first aspect of the invention, by the process having high design margin in circuit design, the display device can be fabricated without dispersing threshold voltage of the thin film transistor and promotion of stability in the operational function of the display device can be achieved. Further, the large capacity can be formed by the small area without particularly increasing photolithography steps simultaneously with fabricating the thin film transistor and promotion of image quality of the display device can be achieved. Further, according to the second aspect of the invention, the fabricating process preferable in reducing the number of steps of the technology is provided and a reduction in fabricating cost in the display device, particularly the light emitting device can be achieved.

What is claimed is:
1. A display device comprising a pixel portion having a plurality of pixels,
   wherein each of the pixels is provided with a pixel electrode, and
   wherein the pixel electrode is connected to a semiconductor element over a substrate,
   wherein the semiconductor element comprises:
   an activation layer,
   a gate insulating film in contact with the activation layer,
   a gate electrode opposed to the activation layer through the gate insulating film,
   a first insulating nitride film provided over the activation layer,
   an organic resin film provided over the first insulating nitride film,
   a second insulating nitride film provided over the organic resin film, and
   a wiring provided over the second insulating nitride film;
   wherein an inner wall face of a first opening portion formed in the organic resin film is covered by the second insulating nitride film;

wherein a second opening portion is formed in a laminated layer body including the gate insulating film, the first insulating nitride film and the second insulating nitride film inside the first opening portion;

wherein the activation layer and the wiring are connected through the first opening portion and the second opening portion;

wherein the pixel electrode is connected to the semiconductor element through the wiring electrically;

wherein a first part of an insulating film is formed over the pixel electrode; and wherein the activation layer is formed over a second part of the insulating film.

2. A display device comprising a pixel portion having a plurality of pixels, wherein each of the pixels is provided with a pixel electrode, wherein the pixel electrode is connected to a semiconductor element over a substrate, wherein the semiconductor element comprises:

an activation layer, a gate insulating film in contact with the activation layer, a gate electrode opposed to the activation layer through the gate insulating film, a first insulating nitride film provided over the activation layer, an organic resin film provided over the first insulating nitride film, a second insulating nitride film provided over the organic resin film, and a wiring provided over the second insulating nitride film;

wherein an inner wall face of a first opening portion formed in the organic resin film is covered by the second insulating nitride film, a bottom face of said first opening portion including a region in which the first insulating nitride film and the second insulating nitride film are brought into contact with each other over 0.3 through 3 µm;

wherein a second opening portion is formed in a laminated layer body including the gate insulating film, the first insulating nitride film and the second insulating nitride film inside the first opening portion;

wherein the activation layer in the wiring are connected through the first opening portion and the second opening portion;

wherein the pixel electrode is connected to the semiconductor element through the wiring electrically;

wherein a first part of an insulating film is formed over the pixel electrode; and wherein the activation layer is formed over a second part of the insulating film.

3. A display device comprising a pixel portion having a plurality of pixels, wherein each of the pixels is provided with a pixel electrode, wherein the pixel electrode is connected to a semiconductor element over a substrate, wherein the semiconductor element comprises:

an activation layer, a gate insulating film in contact with the activation layer, a gate electrode opposed to the activation layer through the gate insulating film, a first insulating nitride film provided over the activation layer, an acrylic film provided over the first insulating nitride film, a second insulating nitride film provided over the acrylic film, and a wiring provided over the second insulating nitride film;

wherein an inner wall face of a first opening portion formed in the acrylic film is covered by the second insulating nitride film;

wherein a second opening portion is formed in a laminated layer body including the gate insulating film, the first insulating nitride film and the second insulating nitride film inside the first opening portion;

wherein the activation layer and the wiring are connected through the first opening portion and the second opening portion;

wherein the pixel electrode is connected to the semiconductor element through the wiring electrically;

wherein a first part of an insulating film is formed over the pixel electrode; and wherein the activation layer is formed over a second part of the insulating film.

4. A display device comprising a pixel portion having a plurality of pixels, wherein each of the pixels is provided with a pixel electrode, wherein the pixel electrode is connected to a semiconductor element over a substrate, wherein the semiconductor element comprises:

an activation layer, a gate insulating film in contact with the activation layer, a gate electrode opposed to the activation layer through the gate insulating film, a first insulating nitride film provided over the activation layer, an acrylic film provided over the first insulating nitride film, a second insulating nitride film provided over the acrylic film, and a wiring provided over the second insulating nitride film;

wherein an inner wall face of a first opening portion formed in the acrylic film is covered by the second insulating nitride film, a bottom face of said first opening portion including a region in which the first insulating film and the second insulating film are brought into contact with each other over 0.3 through 3 µm;

wherein a second opening portion is formed in a laminated layer body including the gate insulating film, the first insulating nitride film and the second insulating nitride film inside the first opening portion;

wherein the activation layer and the wiring are connected through the first opening portion and the second opening portion;

wherein the pixel electrode is connected to the semiconductor element through the wiring electrically;

wherein a first part of an insulating film is formed over the pixel electrode; and wherein the activation layer is formed over a second part of the insulating film.

5. The display device according to claim 1, wherein said organic resin film is photosensitive organic resin film.

6. The display device according to claim 2, wherein said organic resin film is a photosensitive organic resin film.

7. The display device according to claim 3, wherein said acrylic film is a positive type photosensitive acrylic film.

8. The display device according to claim 4, wherein said acrylic film is a positive type photosensitive acrylic film.

9. The display device according to claim 1, wherein each of the first insulating nitride film and the second insulating nitride film comprises at least one selected from a silicon nitride film, a silicon nitrooxide film, a silicon oxynitride film, an aluminum nitride film, an aluminum nitrooxide film and an aluminum oxynitride film.

10. The display device according to claim 2, wherein each of the first insulating nitride film and the second insulating nitride film comprises at least one selected from a silicon nitride film, a silicon nitrooxide film, a silicon oxynitride film, an aluminum nitride film, an aluminum nitrooxide film and an aluminum oxynitride film.

11. The display device according to claim 3, wherein each of the first insulating nitride film and the second insulating nitride film comprises at least one selected from a silicon nitride film, a silicon nitrooxide film, a silicon oxynitride film, an aluminum nitride film, an aluminum nitrooxide film and an aluminum oxynitride film.

12. The display device according to claim 4, wherein each of the first insulating nitride film and the second insulating nitride film comprises at least one selected from a silicon nitride film, a silicon nitrooxide film, a silicon oxynitride film, an aluminum nitride film, an aluminum nitrooxide film and an aluminum oxynitride film.

13. The display device according to claim 1, wherein a radius of curvature at an upper end portion of the first opening portion falls in a range of 3 through 30 μm.

14. The display device according to claim 2, wherein a radius of curvature at an upper end portion of the first opening portion falls in a range of 3 through 30 μm.

15. The display device according to claim 3, wherein a radius of curvature at an upper end portion of the first opening portion falls in a range of 3 through 30 μm.

16. The display device according to claim 4, wherein a radius of curvature at an upper end portion of the first opening portion falls in a range of 3 through 30 μm.

17. The display device according to claim 1, wherein a radius of curvature at an upper end portion of the first opening portion is changed continuously in a range of 3 through 30 μm.

18. The display device according to claim 2, wherein a radius of curvature at an upper end portion of the first opening portion is changed continuously in a range of 3 through 30 μm.

19. The display device according to claim 3, wherein a radius of curvature at an upper end portion of the first opening portion is changed continuously in a range of 3 through 3 μm.

20. The display device according to claim 4, wherein a radius of curvature at an upper end portion of the first opening portion is changed continuously in a range of 3 through 30 μm.

21. The display device according to claim 1, wherein a contact angle θ at a lower end portion of the first opening portion satisfies $30°<\theta<65°$.

22. The display device according to claim 2, wherein a contact angle θ at a lower end portion of the first opening portion satisfies $30°<\theta<65°$.

23. The display device according to claim 3, wherein a contact angle θ at a lower end portion of the first opening portion satisfies $30°<\theta<65°$.

24. The display device according to claim 4, wherein a contact angle θ at a lower end portion of the first opening portion satisfies $30°<\theta<65°$.

25. An electronic device having the display device according to claim 1, wherein said electronic device is selected from the group consisting of a television, a digital camera, a laptop computer, a mobile computer, a portable image reproducing apparatus, a goggle type display, and a video camera.

26. An electronic device having the display device according to claim 2, wherein said electronic device is selected from the group consisting of a television, a digital camera, a laptop computer, a mobile computer, a portable image reproducing apparatus, a goggle type display, and a video camera.

27. An electronic device having the display device according to claim 3, wherein said electronic device is selected from the group consisting of a television, a digital camera, a laptop computer, a mobile computer, a portable image reproducing apparatus, a goggle type display, and a video camera.

28. An electronic device having the display device according to claim 4, wherein said electronic device is selected from the group consisting of a television, a digital camera, a laptop computer, a mobile computer, a portable image reproducing apparatus, a goggle type display, and a video camera.

* * * * *